(12) United States Patent
Hai et al.

(10) Patent No.: US 12,310,135 B2
(45) Date of Patent: May 20, 2025

(54) LINE RECOGNITION MODULE, FABRICATING METHOD THEREOF AND DISPLAY DEVICE

(71) Applicant: BOE Technology Group Co., Ltd., Beijing (CN)

(72) Inventors: Xiaoquan Hai, Beijing (CN); Xiaoliang Ding, Beijing (CN); Xuan Liang, Beijing (CN); Yingzi Wang, Beijing (CN); Sen Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1001 days.

(21) Appl. No.: 17/417,918

(22) PCT Filed: Sep. 24, 2020

(86) PCT No.: PCT/CN2020/117533
§ 371 (c)(1),
(2) Date: Jun. 24, 2021

(87) PCT Pub. No.: WO2022/061670
PCT Pub. Date: Mar. 31, 2022

(65) Prior Publication Data
US 2022/0336510 A1   Oct. 20, 2022

(51) Int. Cl.
*H10F 39/00* (2025.01)
*G02B 5/00* (2006.01)
(Continued)

(52) U.S. Cl.
CPC ......... *H10F 39/8057* (2025.01); *G02B 5/005* (2013.01); *G02B 27/30* (2013.01);
(Continued)

(58) Field of Classification Search
None
See application file for complete search history.

(56) References Cited

U.S. PATENT DOCUMENTS

| | | | |
|---|---|---|---|
| 9,899,558 B2 * | 2/2018 | Im | H10D 86/423 |
| 10,838,221 B2 * | 11/2020 | Hai | G06V 40/1324 |

(Continued)

FOREIGN PATENT DOCUMENTS

| | | | |
|---|---|---|---|
| CN | 101202293 A | 6/2008 | |
| CN | 107423728 A | 12/2017 | |

(Continued)

*Primary Examiner* — Nishath Yasmeen
(74) *Attorney, Agent, or Firm* — ArentFox Schiff LLP; Michael Fainberg

(57) ABSTRACT

The present disclosure provides a line recognition module, a fabricating method thereof and a display device. A better collimating effect may be achieved only by fabricating an optical sensing structure on a substrate in the line recognition module and then directly fabricating at least two light shading layers and a light transmitting layer with relatively simple structures, and the device structure is light and thin, which can reduce the difficulty of processing the device. The problem that the yield is affected due to blistering caused by attaching a collimating structure to the line recognition module with use of an optically clear adhesive (OCA) is avoided. Moreover, since film layers are fabricated directly on the optical sensing structure to form the collimating structure, fabrication of the collimating structure may be accomplished by using a generic device for fabrication of the film layers on an array substrate without adding new fabrication equipment.

19 Claims, 23 Drawing Sheets

(51) Int. Cl.
  *G02B 27/30*    (2006.01)
  *G06V 10/145*   (2022.01)
  *G06V 10/147*   (2022.01)
  *G06V 40/13*    (2022.01)

(52) U.S. Cl.
  CPC .......... *G06V 10/145* (2022.01); *G06V 10/147* (2022.01); *G06V 40/1318* (2022.01); *H10F 39/024* (2025.01); *H10F 39/802* (2025.01); *H10F 39/811* (2025.01)

(56) References Cited

U.S. PATENT DOCUMENTS

| | | | |
|---|---|---|---|
| 11,637,139 B2* | 4/2023 | Lao | G02B 5/005 |
| | | | 257/435 |
| 2009/0057564 A1* | 3/2009 | Miyayama | H01L 27/14663 |
| | | | 257/292 |
| 2010/0237250 A1* | 9/2010 | Hayashi | H01L 27/14632 |
| | | | 250/361 R |
| 2015/0097180 A1* | 4/2015 | Yu | H10F 39/026 |
| | | | 438/85 |
| 2015/0349016 A1* | 12/2015 | Ham | H10F 39/014 |
| | | | 257/43 |
| 2018/0270403 A1* | 9/2018 | Chung | H10F 39/806 |
| 2019/0172875 A1 | 6/2019 | Kang et al. | |
| 2019/0243154 A1 | 8/2019 | Hai et al. | |
| 2020/0293738 A1* | 9/2020 | Zhang | G06V 40/1318 |
| 2020/0293741 A1* | 9/2020 | Du | G06V 40/1329 |
| 2020/0303441 A1* | 9/2020 | Lao | H10F 39/8057 |
| 2020/0327296 A1* | 10/2020 | Wu | H01L 27/14678 |
| 2021/0174049 A1 | 6/2021 | Hai et al. | |
| 2021/0357616 A1 | 11/2021 | Gu et al. | |
| 2021/0366966 A1 | 11/2021 | Li et al. | |

FOREIGN PATENT DOCUMENTS

| | | |
|---|---|---|
| CN | 108227230 A | 6/2018 |
| CN | 108241824 A | 7/2018 |
| CN | 109239938 A | 1/2019 |
| CN | 109271829 A | 1/2019 |
| CN | 209640881 U | 11/2019 |
| CN | 209729912 U | 12/2019 |
| CN | 111062336 A | 4/2020 |
| CN | 111240031 A | 6/2020 |
| CN | 111259681 A | 6/2020 |
| CN | 111291719 A | 6/2020 |
| CN | 111564506 A | 8/2020 |

* cited by examiner

LINE RECOGNITION MODULE, FABRICATING METHOD THEREOF AND DISPLAY DEVICE

This disclosure is a US National Stage of International Application No. PCT/CN2020/117533, filed on Sep. 24, 2020, and entitled "LINE RECOGNITION MODULE, FABRICATING METHOD THEREOF AND DISPLAY DEVICE", the content of which is hereby incorporated by reference in its entirety.

FIELD

The present disclosure relates to the field of display, in particular to a line recognition module, a fabricating method thereof, and a display device.

BACKGROUND

During optical image acquisition, when the distance between an object and an optical sensing structure is too large, an acquired image is blurry. Further, there is a problem of cross-talk of acquired light rays of the object, resulting in failure in acquiring a clear image of the object eventually.

SUMMARY

An embodiment of the present disclosure provides a line recognition module, including a line recognition area and a peripheral area surrounding the line recognition area, the peripheral area including a bonding area, where the line recognition module includes: a substrate; an optical sensing structure located on the substrate and within the line recognition area; and a collimating structure located on a side of the optical sensing structure facing away from the substrate, at least located within the line recognition area and not covering the bonding area, where the collimating structure includes at least two light shading layers disposed in a stacked manner and a light transmitting layer located between every two adjacent light shading layers, each of the light shading layers has light transmitting holes arranged in an array, the light transmitting holes in the respective light shading layers are in one-to-one correspondence, and at least part of orthographic projections of the light transmitting holes onto the substrate coincide.

In one possible implementation, in the line recognition module provided by the embodiment of the present disclosure, the light transmitting layer includes a transparent resin layer and a transparent inorganic insulating layer; and between the two adjacent light shading layers, the transparent resin layer is contiguous with the light shading layer on a side adjacent to the substrate, and the transparent inorganic insulating layer is contiguous with the light shading layer on a side away from the substrate.

In one possible implementation, in the line recognition module provided by the embodiment of the present disclosure, the collimating structure includes a first light shading layer, a first transparent resin layer, a first transparent inorganic insulating layer, a second light shading layer, a second transparent resin layer, a second transparent inorganic insulating layer and a third light shading layer disposed in sequence in a stacked manner on the optical sensing structure; and the first light shading layer includes first light transmitting holes arranged in an array, the second light shading layer includes second light transmitting holes arranged in an array, and the third light shading layer includes third light transmitting holes arranged in an array.

In one possible implementation, in the line recognition module provided by the embodiment of the present disclosure, an aperture of each of the first light transmitting holes is greater than or equal to an aperture of each of the third light transmitting holes.

In one possible implementation, in the line recognition module provided by the embodiment of the present disclosure, an aperture of each of the second light transmitting holes is equal to the aperture of each of the first light transmitting holes.

In one possible implementation, in the line recognition module provided by the embodiment of the present disclosure, an aperture of each of the second light transmitting holes is 50% to 80% of the aperture of each of the first light transmitting holes.

In one possible implementation, in the line recognition module provided by the embodiment of the present disclosure, the apertures of the first light transmitting holes, the second light transmitting holes and the third light transmitting holes successively decrease.

In one possible implementation, in the line recognition module provided by the embodiment of the present disclosure, a thickness of the first transparent resin layer is greater than a thickness of the second transparent resin layer.

In one possible implementation, in the line recognition module provided by the embodiment of the present disclosure, the aperture of each of the first light transmitting holes ranges from 3 μm to 8 μm, a period of each of the first light transmitting holes ranges from 10 μm to 40 μm, a thickness of the first transparent resin layer ranges from 10 μm to 15 μm, and a thickness of the second transparent resin layer ranges from 8 μm to 12 μm.

In one possible implementation, in the line recognition module provided by the embodiment of the present disclosure, the collimating structure includes a first light shading layer, a transparent resin layer, a transparent inorganic insulating layer and a second light shading layer arranged in sequence in a stacked manner on the optical sensing structure; and the first light shading layer includes first light transmitting holes arranged in an array, and the second light shading layer includes second light transmitting holes arranged in an array.

In one possible implementation, in the line recognition module provided by the embodiment of the present disclosure, an aperture of each of first light transmitting holes is equal to an aperture of each of second light transmitting holes.

In one possible implementation, in the line recognition module provided by the embodiment of the present disclosure, the aperture of each of the first light transmitting holes ranges from 2 μm to 10 μm, a period of each of the first light transmitting holes ranges from 13 μm to 60 μm, and a thickness of the transparent resin layer ranges from 5 μm to 30 μm.

In one possible implementation, in the line recognition module provided by the embodiment of the present disclosure, a collimation light collection angle θ of the collimating structure satisfies the following relationship: $\tan\theta = D/H = C_{min}/2H_x$, where D is an aperture of a light transmitting hole, H is a height of the collimating structure, $C_{min}$ is a finger valley-ridge interval, and $H_x$ is an interval from a finger to the collimating structure.

In one possible implementation, in the line recognition module provided by the embodiment of the present disclosure, orthographic projections of centers of the light transmitting holes in one-to-one correspondence in each of the light shading layers on the substrate coincide, and periods of the light transmitting holes in each of the light shading layers are the same.

In one possible implementation, in the line recognition module provided by the embodiment of the present disclosure, the optical sensing structure includes a plurality of optical sensors arranged in an array, one of the optical sensors corresponding to the light transmitting holes in each of the light shading layers.

In one possible implementation, in the line recognition module provided by the embodiment of the present disclosure, the optical sensing structure includes a gate, a gate insulating layer, an active layer, a source-drain layer, a first insulating layer, a first electrode, a semiconductor layer, a second electrode, a protective layer, a passivation layer, a second insulating layer, a bias voltage line, and a barrier layer arranged in sequence in a stacked manner.

In one possible implementation, in the line recognition module provided by the embodiment of the present disclosure, an orthographic projection of the source-drain layer on the substrate completely covers and is larger than an orthographic projection of the first electrode on the substrate.

In one possible implementation, in the line recognition module provided by the embodiment of the present disclosure, the source-drain layer and the first electrode are multiplexed on the same film layer.

In one possible implementation, in the line recognition module provided by the embodiment of the present disclosure, the light shading layers extend from the line recognition area to an adjoining edge of the peripheral area; an orthographic projection of the transparent resin layer on the substrate completely covers an orthographic projection of the light shading layer contiguous with the transparent resin layer on the substrate; and an orthographic projection of the transparent inorganic insulating layer on the substrate completely covers and is larger than the orthographic projection of the transparent resin layer contiguous with the transparent inorganic insulating layer on the substrate.

In one possible implementation, in the line recognition module provided by the embodiment of the present disclosure, the collimating structure further includes a retaining wall structure arranged around the transparent resin layer and independent of the light shading layer contiguous with the transparent resin layer on the same layer.

In one possible implementation, in the line recognition module provided by the embodiment of the present disclosure, a material of the transparent inorganic insulating layer includes silicon nitride or silicon oxynitride formed by low temperature chemical vapor deposition.

In one possible implementation, the line recognition module provided by the embodiment of the present disclosure further includes: a planarization layer located between the collimating structure and the optical sensing structure, where the planarization layer is arranged in an intact surface manner and has a hollow-out pattern only in the bonding area.

In one possible implementation, in the line recognition module provided by the embodiment of the present disclosure, a material of the planarization layer includes silicon oxide or silicon nitride.

In one possible implementation, the line recognition module provided by the embodiment of the present disclosure further includes: a grounded shield layer located between the planarization layer and the optical sensing structure; and the grounded shield layer is contiguous with the planarization layer, a pattern of the grounded shield layer is covered by a pattern of the planarization layer, and an orthographic projection of the grounded shield layer on the substrate covers the optical sensing structure.

In one possible implementation, in the line recognition module provided by the embodiment of the present disclosure, a material of the grounded shield layer includes indium tin oxide.

In one possible implementation, the line recognition module provided by the embodiment of the present disclosure further includes: a noise reduction metal layer located between the grounded shield layer and the optical sensing structure; the line recognition area includes a photosensitive area, an interval area, and a light shading area, and the interval area is located between the photosensitive area and the light shading area; the optical sensing structure is disposed within the photosensitive area and the light shading area, with no pattern disposed within the interval area; and the noise reduction metal layer covers the light shading area.

In one possible implementation, in the line recognition module provided by the embodiment of the present disclosure, the light shading area is located on one side or on two opposite sides of the photosensitive area.

In one possible implementation, the line recognition module provided by the embodiment of the present disclosure further includes: a third insulating layer located between the grounded shield layer and the noise reduction metal layer; and the noise reduction metal layer covers the interval area, and within the interval area, the noise reduction metal layer is electrically connected with the grounded shield layer through a plurality of via holes penetrating through the third insulating layer.

In one possible implementation, the line recognition module provided by the embodiment of the present disclosure further includes: a bonding electrode located within the bonding area and arranged on the same layer as the noise reduction metal layer.

In one possible implementation, in the line recognition module provided by the embodiment of the present disclosure, materials of the noise reduction metal layer and the bonding electrode include titanium/aluminum/titanium.

In one possible implementation, in the line recognition module provided by the embodiment of the present disclosure, the bonding area includes a gate drive chip bonding area, and a bonding electrode located in the gate drive chip bonding area is referred to as a first bonding electrode; and a first connection electrode located on a film layer where a gate is located, a second connection electrode located on a source-drain layer, a third connection electrode located on a film layer where a first electrode is located, and a fourth connection electrode located on a bias voltage line are arranged between the first bonding electrode and the substrate; the first connection electrode is electrically connected with the second connection electrode by a first via hole penetrating through a gate insulating layer, the second connection electrode is electrically connected with the third connection electrode by a second via hole penetrating through a first insulating layer, the third connection electrode is electrically connected with the fourth connection electrode by a third via hole penetrating through a second insulating layer, and the fourth connection electrode is electrically connected with the first bonding electrode by a fourth via hole penetrating through a third insulating layer; and the first connection electrode is electrically connected with the gate through a gate line and a gate line fan-out routing wire.

In one possible implementation, in the line recognition module provided by the embodiment of the present disclosure, the first via hole, the second via hole, and the third via hole corresponding to one first bonding electrode are each at least two in number, orthographic projections of the first via holes, the second via holes, and the third via holes on the substrate do not overlap with one another, the first via holes, the second via holes and the third via holes are arranged alternately in an extension direction of the first bonding electrode, and the one first bonding electrode corresponds to one of the fourth via holes whose orthographic projections on the substrate simultaneously cover the first via holes, the second via holes, and the third via holes.

In one possible implementation, in the line recognition module provided by the embodiment of the present disclosure, the bonding area further includes a data drive chip bonding area, and bonding electrodes located within the data drive chip bonding area are referred to as a second bonding electrode and a third bonding electrode; a fifth connection electrode located on the source-drain layer, a sixth connection electrode located on the film layer where the first electrode is located, and a seventh connection electrode located on the bias voltage line are arranged between the second bonding electrode and the substrate; and the seventh connection electrode is electrically connected with the source-drain layer through a data line and a data line fan-out routing wire; and the third bonding electrode is located at one side edge of the data drive chip bonding area, and an eighth connection electrode located on the bias voltage line is arranged between the third bonding electrode and the substrate; and the eighth connection electrode is electrically connected with the bias voltage line through a bias voltage signal line and a bias voltage fan-out routing wire.

In one possible implementation, in the line recognition module provided by the embodiment of the present disclosure, the orthographic projections of the centers of the light transmitting holes in one-to-one correspondence in each of the light shading layers on the substrate coincide, and the periods of the light transmitting holes in each of the light shading layers are the same; and the optical sensing structure includes a plurality of optical sensors arranged in an array, and one of the optical sensors corresponds to a plurality of light transmitting holes in each of the light shading layers.

In another aspect, an embodiment of the present disclosure also provides a display device including the line recognition module provided by the above embodiments of the present disclosure, and a display panel located on the line recognition module, the display panel and the line recognition module are fixed by an optically clear adhesive.

In one possible implementation, in the display device provided by the embodiment of the present disclosure, the display panel is an OLED display panel; and the OLED display panel includes a flexible OLED display backplane, a polarizer, and a protective cover plate disposed in sequence in a stacked manner, and a material of the protective cover plate includes polyimide.

In one possible implementation, in the display device provided by the embodiment of the present disclosure, a thickness of the OLED display panel ranges from 0.4 mm to 0.65 mm.

In another aspect, an embodiment of the present disclosure also provides a method for fabricating a line recognition module, the line recognition module includes a line recognition area and a peripheral area surrounding the line recognition area, and the peripheral area includes a bonding area, where the fabricating method includes: providing a substrate; forming an optical sensing structure arranged in an array on the substrate and within the line recognition area; and forming a collimating structure on the optical sensing structure by using a low temperature process, where the collimating structure is at least located within the line recognition area, does not cover the bonding area, and includes at least two light shading layers disposed in a stacked manner and a light transmitting layer located between every two adjacent light shading layers, each of the light shading layers has light transmitting holes arranged in an array, the light transmitting holes in the respective light shading layers are in one-to-one correspondence and at least part of orthographic projections of the light transmitting holes onto the substrate coincide.

In one possible implementation, the fabricating method provided by the embodiment of the present disclosure, before forming the collimating structure on the optical sensing structure, further includes: forming a noise reduction metal layer on the optical sensing structure while forming a bonding electrode in the bonding area; forming a grounded shield layer on the bonding electrode and the noise reduction metal layer, where the grounded shield layer and the bonding electrode do not overlap with each other; and forming a planarization layer on the grounded shield layer by using plasma enhanced chemical vapor deposition, where the planarization layer is disposed on the substrate in an intact surface manner and has a hollow-out pattern only in the bonding area.

In one possible implementation, in the fabricating method provided by the embodiment of the present disclosure, forming the light transmitting layer in the collimating structure further includes: forming a transparent resin layer on the light shading layers by inkjet printing; and forming a transparent inorganic insulating layer covering and larger than the transparent resin layer on the transparent resin layer by low temperature chemical vapor deposition.

DETAILED DESCRIPTION OF THE EMBODIMENTS

Figure 1:
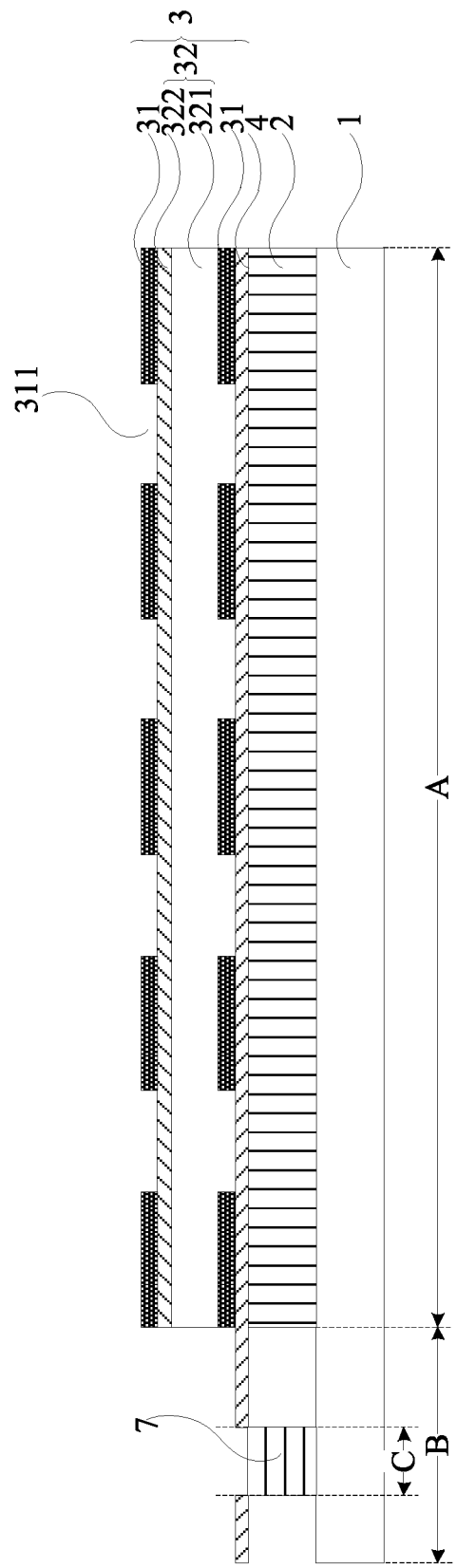
FIG. 1 is a schematic structural diagram of a line recognition module provided by an embodiment of the present disclosure.

Embodiments of the present disclosure provide a line recognition module, a fabricating method thereof, and a display device. In order to make objectives, technical solutions and advantages of the present disclosure clearer, detailed implementations of the line recognition module, the fabricating method thereof, and the display device provided by the embodiments of the present disclosure will be described in detail below with reference to the accompanying drawings. It should be understood that the preferred embodiments described below are only for the purpose of illustrating and explaining the present disclosure, and are not intended to limiting the present disclosure. The embodiments and features of the embodiments in the present application may be combined with each other without conflict.

The shapes and sizes of various components in the drawings do not reflect the true scale and are intended to be merely illustrative of the contents of the present disclosure.

Figure 2:
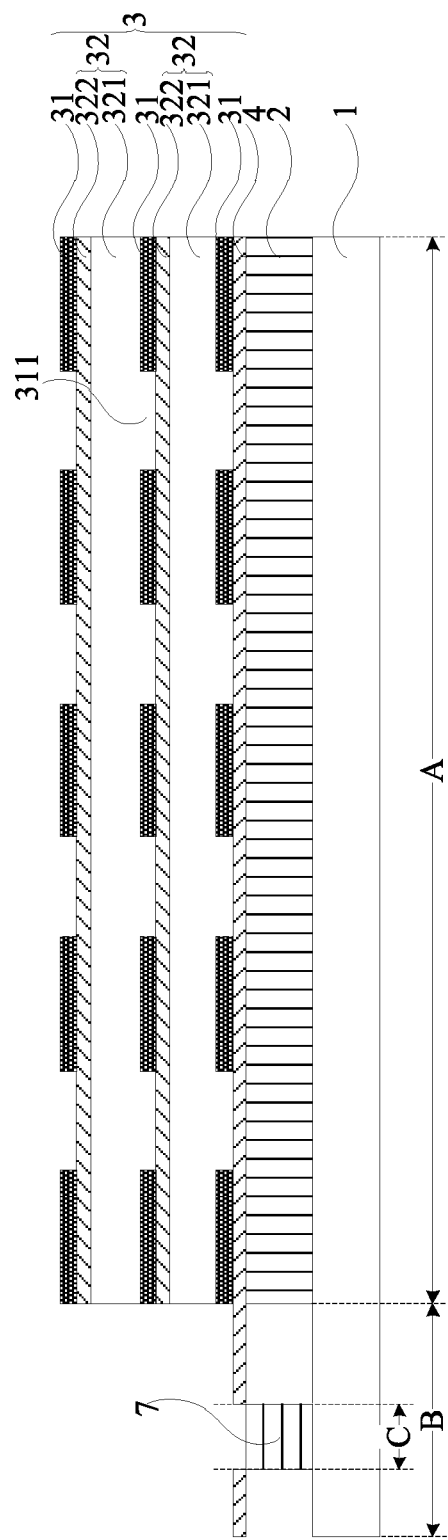
FIG. 2 is another schematic structural diagram of a line recognition module provided by an embodiment of the present disclosure.

An embodiment of the present disclosure provides a line recognition module for recognition and detection of biometric features such as fingerprint, palm print, and the like. As shown in FIGS. 1 and 2, the line recognition module includes a line recognition area A and a peripheral area B surrounding the line recognition area A, and the peripheral area B includes a bonding area C.

The line recognition module includes: a substrate 1, where a material of the substrate 1 may be PI, glass, or other materials; an optical sensing structure 2, located on the substrate 1 and within the line recognition area A; and a collimating structure 3, located on a side of the optical sensing structure 2 facing away from the substrate 1, at least within the line recognition area A and not covering the bonding area C.

The collimating structure 3 includes at least two light shading layers 31 arranged in a stacked manner and a light transmitting layer 32 located between every two adjacent light shading layers. Each of the light shading layers 31 has light transmitting holes 311 arranged in an array, the light transmitting holes 311 in the respective light shading layers 31 are in one-to-one correspondence, and at least part of orthographic projections of the light transmitting holes 311 onto the substrate 1 coincide.

Specifically, in the collimating structure 3 of the line recognition module provided by the embodiment of the present disclosure, the light transmitting holes 311 in each light shading layer 31 are equal in quantity, are the same in position and are in a one-to-one correspondence relation. Optionally, orthographic projections of centers of the light transmitting holes 311 in one-to-one correspondence in each of the light shading layers 31 on the substrate 1 may be set to coincide, ensuring that periods P of the light transmitting holes 311 in each of the light shading layers 31 are the same, where the period of the light transmitting holes 311 refers to the distance between the centers of two adjacent light transmitting holes 311. During fabrication, the orthogonal projections of the light transmitting holes 311 in the same position in the light shading layers 31 on the substrate 1 overlap as completely as possible, but depending on alignment errors in the actual fabrication process, there will be a certain offset between the light transmitting holes 311 in the same position of the light shading layers, and complete overlap cannot be guaranteed, i.e., partial overlap may exist.

An area where the orthographic projections of the light transmitting holes 311 in the same position of the light shading layers 31 on the substrate 1 completely overlap constitutes a sleeve hole structure so light rays at various angles entering the position may be collimated, light rays at angles (small angles) in a certain angle range from a normal perpendicular to the surface of the collimating structure may pass through the sleeve hole structure, and light rays at angles beyond the certain angle range (large angles) are cut off. A difference value between a minimum angle and a maximum angle through which the light rays may pass is a light collection angle θ.

Specifically, in the line recognition module provided by the embodiment of the present invention, the collimating structure including the plurality of light shading layers 31 having the light transmitting holes 311 is adopted, distances between the light shading layers 31 are adjusted through the light transmitting layers 32, and a distance between a light shading layer 31 at the top and a light shading layer 31 at the bottom as well as apertures and periods of the light transmitting holes 311 are determined so as to adjust a desired depth-to-width ratio of a sleeve hole to define the light collection angle θ of the collimating structure, thereby achieving a desired collimating effect and achieving accurate acquisition of information of a valley and a ridge of a line. Furthermore, the apertures of the light shading layer 31 at the top and the light shading layer 31 at the bottom generally need to be consistent in order to guarantee the desired light collection angle θ.

Specifically, the number of the light shading layers 31 in the collimating structure 3 may be shown in FIG. 1. That is, two light shading layers 31 are adopted and one light transmitting layer 32 is arranged between the two light shading layers 31. Alternatively, as shown in FIG. 2, the light shading layers 31 are arranged between every two light shading layers 31, namely three light shading layers 31 are adopted and two light transmitting layers 32 are arranged between the three light shading layers 31. The distances between the light shading layers 31 are adjusted through the light transmitting layers 32, allowing light of all the adjacent light transmitting holes 311 to be blocked or absorbed by the light shading layers 31 without influence of stray light, i.e., the light shading layer 31 in the middle can block light ray crosstalk between the light transmitting holes 311 and improve the accuracy of the recognized line information. Specific parameters of the collimating structure 3 are described in detail in a subsequent display device. Further, in the light shading layers 31, the larger the periods of the light transmitting holes 311, i.e., the distance between the light transmitting holes 311, are and the smaller the apertures of the light transmitting holes 311 are, the smaller the light ray crosstalk between the light transmitting holes 311 will be, but increasing the periods of the light transmitting holes 311 and decreasing the apertures of the light transmitting holes 311 affect the light transmittance of the light shading layers 31, so considering the problem of light transmittance, the apertures of the light transmitting holes 311 in the top light shading layer 31 and the bottom light shading layer 31 need to be set to be relative values; and while the light transmitting holes 311 in the middle light shading layer 31 have a relatively small influence on the light transmittance, the crosstalk of the light rays between the adjacent light transmitting holes 311 can be weakened by narrowing the apertures of the light transmitting holes 311 in the middle light shading layer 31. Specifically, the aperture value of the middle light shading layer 31 may be 20% to 50% smaller relative to the aperture value of the top light shading layer 31.

Specifically, in the line recognition module provided by the embodiment of the present disclosure, a better collimating effect may be achieved only by fabricating the optical sensing structure 2 on the substrate 1 and then directly fabricating at least two light shading layers 31 and the light transmitting layers 32 with relatively simple structures, and a device is light and thin in structure, which can reduce the difficulty of processing the device. The problem that the yield is affected due to blistering caused by adopting optically clear adhesive (OCA) for attaching the collimating structure to the line recognition module is avoided. Moreover, since film layers are fabricated directly on the optical sensing structure 2 to form the collimating structure 3, fabrication of the collimating structure 3 may be accomplished by using general equipment for fabrication of the film layers on an array substrate without adding new fabrication equipment.

Figure 3A:
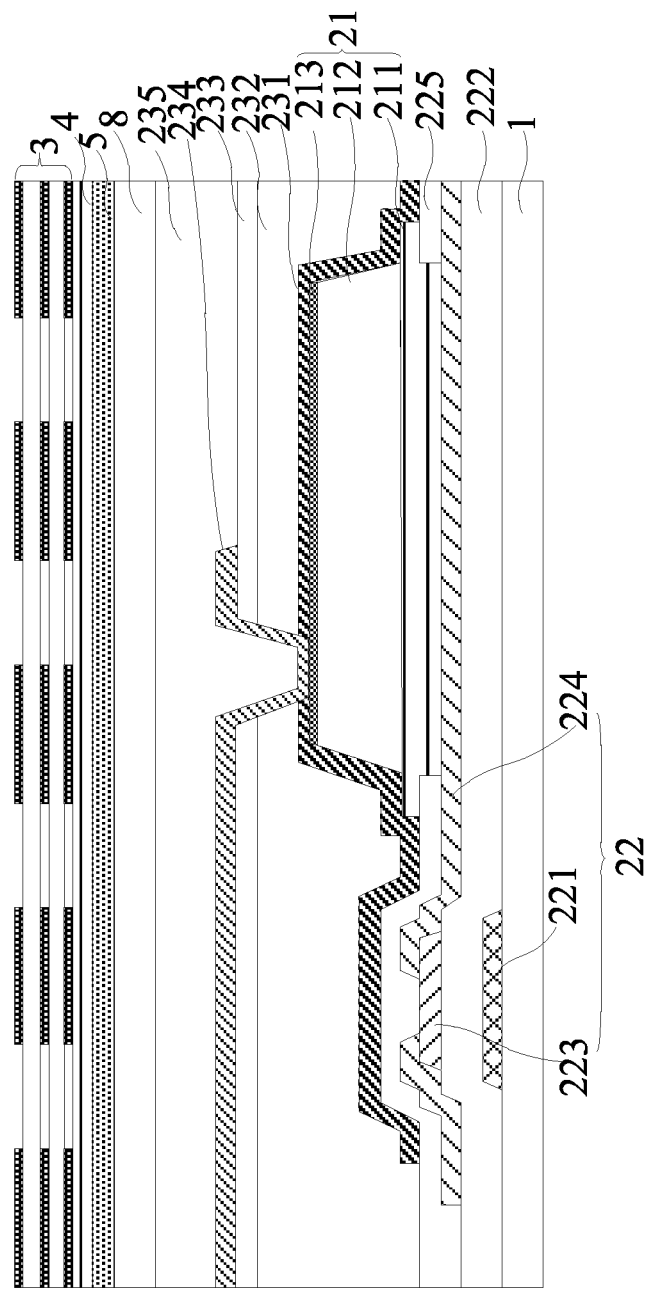
FIG. 3A is a schematic structural diagram of one optical sensor in a line recognition module provided by an embodiment of the present disclosure.
Figure 3B:
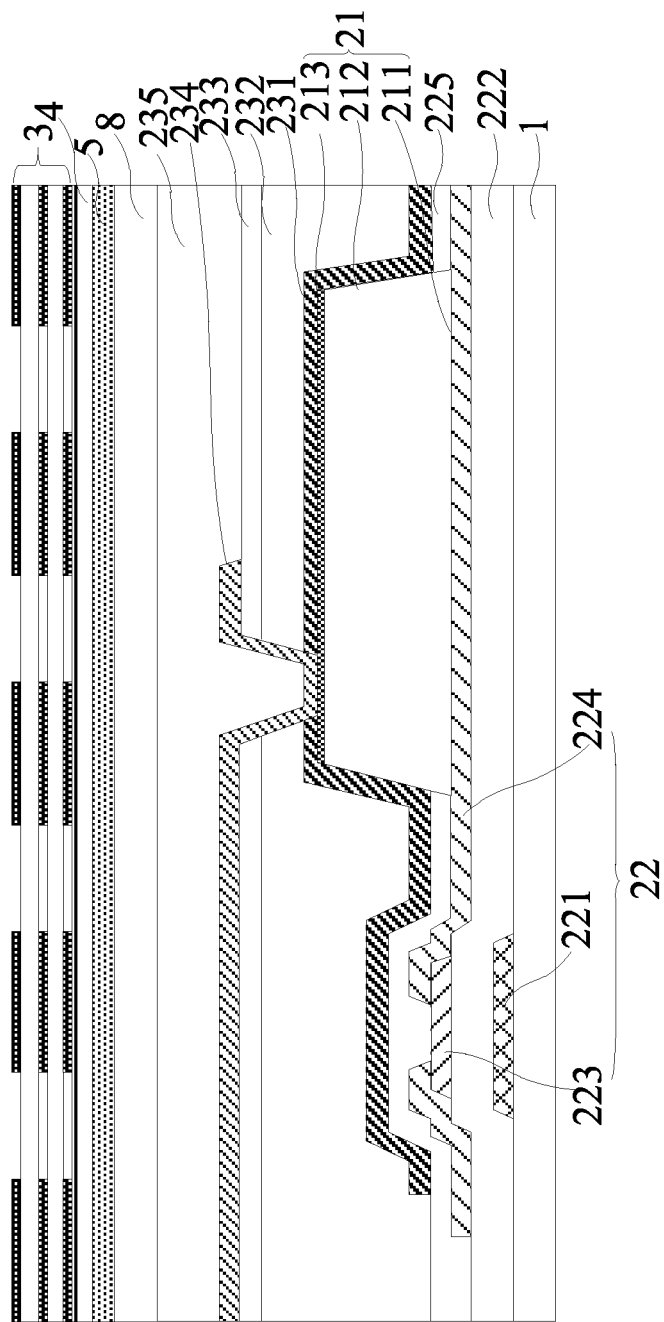
FIG. 3B is another schematic structural diagram of one optical sensor in a line recognition module provided by an embodiment of the present disclosure.
Figure 10A:
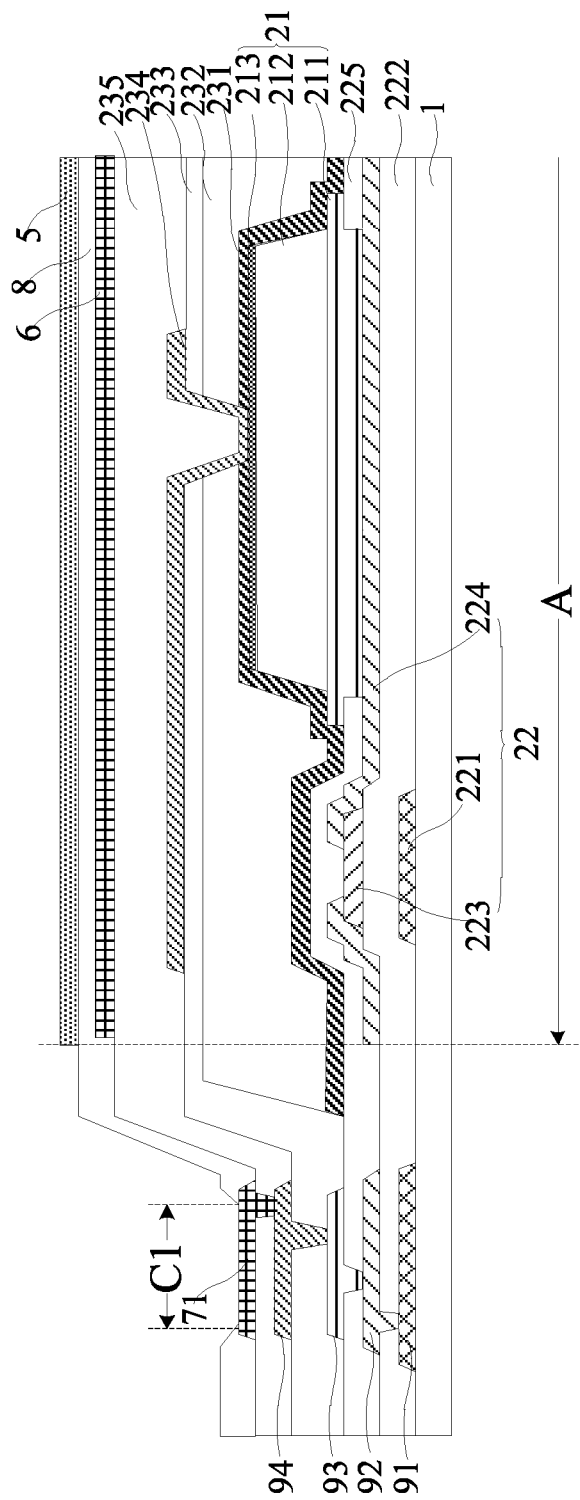
FIG. 10A is another schematic structural diagram of a line recognition module provided by an embodiment of the present disclosure.
Figure 10B:
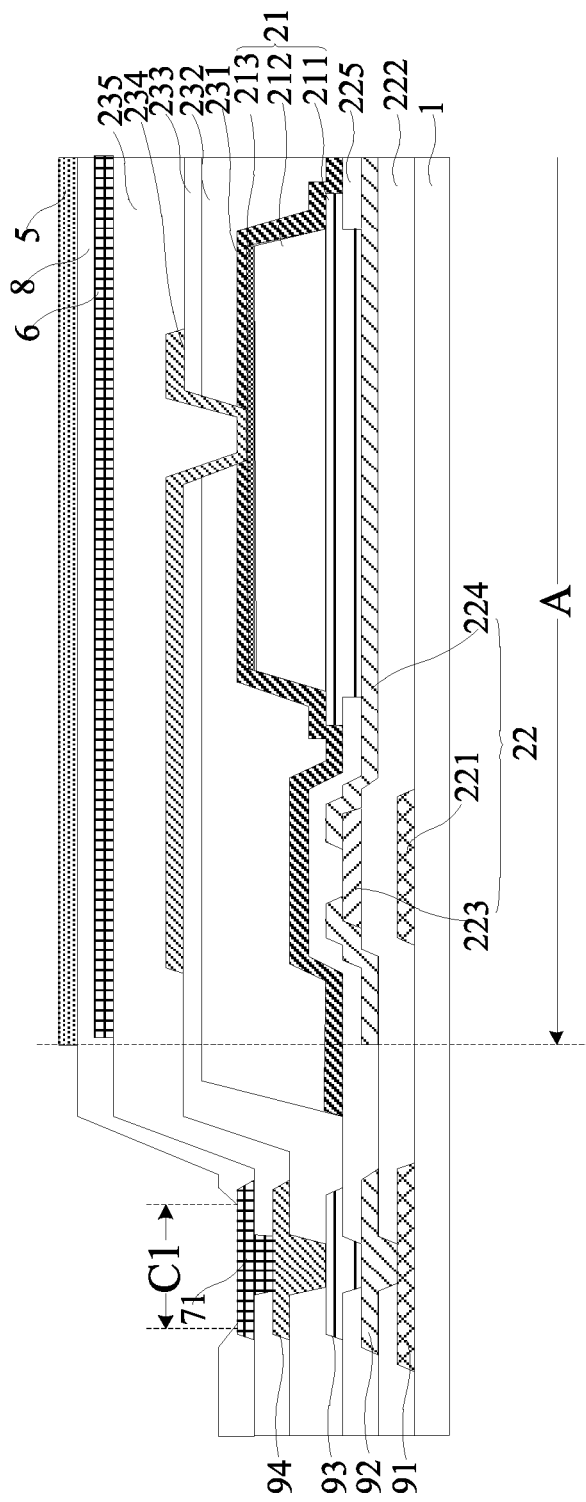
FIG. 10B is another schematic structural diagram of a line recognition module provided by an embodiment of the present disclosure.
Figure 10C:
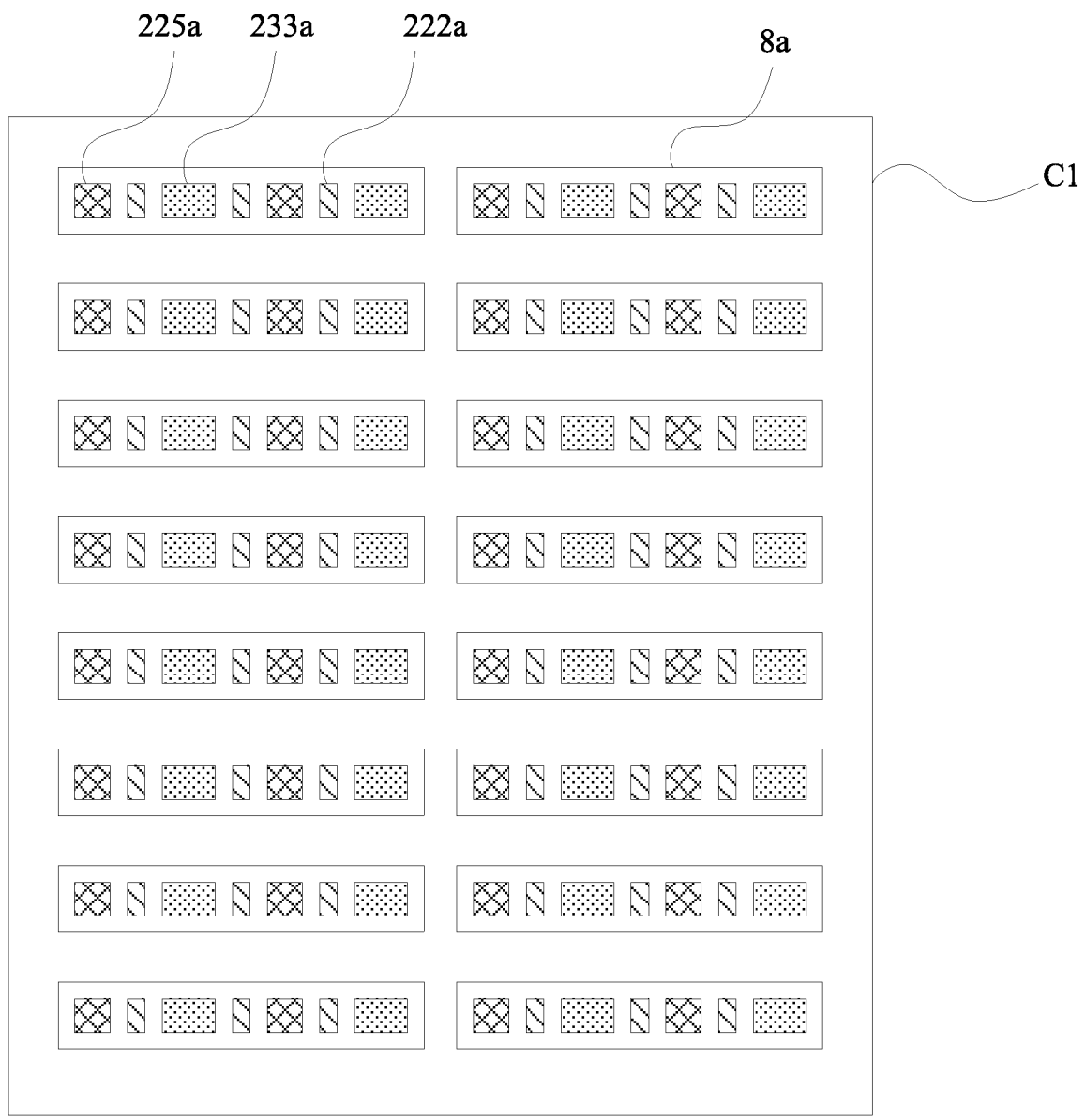
FIG. 10C is a schematic structural diagram of a drive gate bonding area in a line recognition module provided by an embodiment of the present disclosure.

Specifically, in the line recognition module provided by the embodiment of the present disclosure, as shown in FIGS. 10A and 10C, the optical sensing structure 2 is generally arranged only in the line recognition area A (generally corresponding to a display area in a display panel), a wire led out from the line recognition area A is arranged in the peripheral area B, a bonding electrode 7 is arranged in the bonding area C, and a surface of the bonding electrode needs to be exposed in order to be fixed with a drive chip. Since the collimating structure 3 is for collimating the light rays acquired by the optical sensing structure 2, the film layers of the collimating structure 3 need to cover the optical sensing structure 2 and avoid covering the bonding electrode 7 in the bonding area C. Optionally, in the line recognition module provided by the embodiment of the present disclosure, as shown in FIG. 3A, the optical sensing structure 2 includes a plurality of optical sensors 21 arranged in an array and drive transistors 22 for driving the optical sensors 21. Each of the optical sensors includes a PIN photodiode and a PN photosensitive diode, where each PIN photodiode includes a second electrode 213, a first electrode 211 and a semiconductor layer 212 between the second electrode 213 and the first electrode 211. The first electrodes 211 are electrically connected with the drive transistors 22 such that the drive transistors 22 can control voltage applied to the first electrodes 211 and then control operating states of the optical sensors 21. Each of the semiconductor layers 212 includes a P-type semiconductor layer and an N-type semiconductor layer (e.g., an N-type Si layer) disposed in a stacked manner, or includes a P-type semiconductor layer (e.g., a P-type Si layer), an intrinsic semiconductor layer (e.g., an intrinsic Si layer), and an N-type semiconductor layer (e.g., an N-type Si layer) disposed in a stacked manner. For example, an I layer is an a-Si material, a P layer is a material a-Si doped with B ions, and an N layer is a material a-Si doped with P ions. For example, each of the second electrodes 213 is a transparent electrode, and materials such as transparent metal oxides like indium tin oxide (ITO), indium zinc oxide (IZO), or gallium zinc oxide (GZO), etc. may be used. Each of the first electrodes 211 is a metal electrode, and a metal material such as copper (Cu), aluminum (Al), or titanium (Ti) or an alloy material is used. Each of the drive transistors 22 includes a gate, a gate insulating layer, an active layer, a source and a drain. Specifically, the optical sensing structure 2 includes a gate 221, a gate insulating layer 222, an active layer 223, a source-drain layer 224, a first insulating layer 225, the first electrodes 211, the semiconductor (PIN) layers 212, the second electrodes 213, a protective layer 231, a passivation layer 232, a second insulating layer 233, a bias voltage line 234 and a barrier layer 235 disposed in sequence in a stacked manner on the substrate 1. Moreover, the source-drain layer extends to one side of the PIN, and an orthographic projection of the source-drain layer 224 onto the substrate 1 may completely cover and is larger than orthographic projections of the first electrodes 211 onto the substrate 1, which may increase a photosensitive area. Correspondingly, the process of making a mask of each film layer in the line recognition area A includes: gate 221→gate insulating layer 222→active layer 223→source-drain layer 224→first insulating layer 225→first electrodes 211→PIN 212→second electrodes 213→passivation layer 232→second insulating layer 233→bias voltage line 234→barrier layer 235, etc. A pattern of a data line 224' is also arranged in the source-drain layer 224, and the passivation layer 232 and the second insulating layer 233 are separately patterned, so sizes via holes of them are different. FIG. 3D is a schematic top view of the optical sensors 21 and the drive transistors 22, where it can be seen that a via 232a in the passivation layer 232 is larger than a via 233a in the second insulating layer 233. A structure of the optical sensing structure 2 is not limited to a specific structure shown in FIG. 3A. The source-drain layer 224 and the first electrodes 211 may be multiplexed and combined into a same film layer as shown in FIG. 3B, i.e., the source and the drain and the first electrodes may be integrally formed, i.e., the source-drain layer extends to a PIN side and is multiplexed as a first electrode of the PIN.

Specifically, due to limitations of process fabrication, typically one optical sensor 21 has a size in the range of 50.4 µm to 127.5 µm, PPI of the optical sensor 21 is typically in a range of 200 to 500, and the periods of the light transmitting holes 311 in the collimating structure 3 are typically in a range of about 13 µm to 60 µm, so one optical sensor 21 corresponds to a plurality of light transmitting holes 311 in each of the light shading layers 31, e.g., a few to hundreds of light transmitting holes 311.

Figure 4:
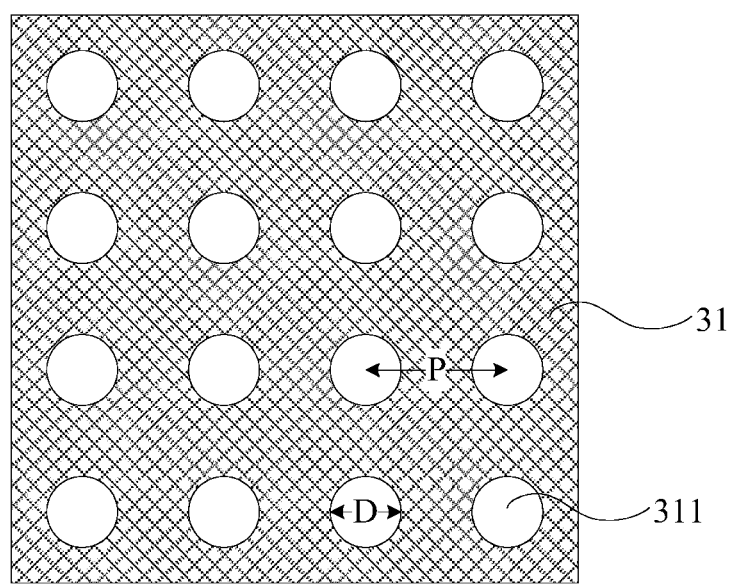
FIG. 4 is a schematic diagram of an arrangement of light transmitting holes in a line recognition module provided by an embodiment of the present disclosure.
Figure 5:
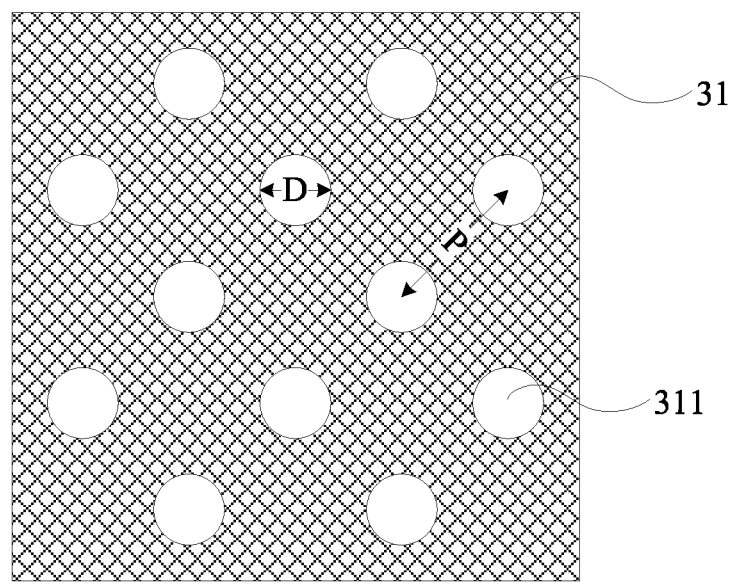
FIG. 5 is a schematic diagram of another arrangement of light transmitting holes in a line recognition module provided by an embodiment of the present disclosure.

Specifically, as shown in FIG. 4, the light transmitting holes 311 in the light shading layers 31 may be arranged in a matrix manner, i.e., the light transmitting holes 311 are aligned in both a row direction and a column direction. The light transmitting holes 311 in the light shading layers 31 may also be arranged hexagonally, i.e., the light transmitting holes 311 are aligned in both diagonal directions as shown in FIG. 5. The light transmitting holes 311 may be circular or square, which is not limited here.

Specifically, in the line recognition module provided by the embodiment of the present disclosure, the light shading layers 31 may generally be made of a material with a high light shading capability like black resin such as BM. Process parameters of each of the light shading layers 31 are generally the same, the thickness thereof is small and is generally between 500 angstroms and 16000 angstroms, and it needs to be guaranteed that an OD value of each of the light shading layers 31 is not less than 3, where the OD value refers to the light transmittance of the film layer. When OD=1, the light transmittance of the film layer is 10%, when OD value=2, the light transmittance of the film layer is 1%, when OD=3, the light transmittance of the film layer is 0.1%, and when OD value=4, the light transmittance of the film layer is 0.01%. That is, the larger the OD value, the better the light shading effect of the film layer. Specifically, a whole layer of the substrate 1 is generally coated with a film layer during fabrication of the light shading layers 31, and then the light transmitting holes 311 are formed by using photolithography or nanoimprinting.

Optionally, in the line recognition module provided by the embodiment of the present disclosure, as shown in FIGS. 1 and 2, each light transmitting layer 32 may include a transparent resin layer 321 and a transparent inorganic insulating layer 322. Between two adjacent light shading layers 31, the transparent resin layer 321 is contiguous to the light shading layer 31 on a side adjacent to the substrate 1, and the transparent inorganic insulating layer 322 is contiguous to the light shading layer 31 on a side away from the substrate 1.

Specifically, the transparent resin layer 321 and the transparent inorganic insulating layer 322 in the light transmitting layer 32 may be fabricated through equipment for fabricating a thin film encapsulation structure in the array substrate, i.e., the transparent inorganic insulating layer 322 may be fabricated by using chemical vapor deposition (CVD) equipment for fabricating an inorganic thin film encapsulation layer, and the transparent resin layer 321 may be fabricated by using inkjet printing (IJP) equipment for fabricating an organic thin film encapsulation layer. After the light shading layers 31 are fabricated, the transparent resin layer 321 may be formed first to ensure that a thickness required for the entire light transmitting layer 32 is generally on the order of micrometers, then the transparent inorganic insulating layer 322 with a small thickness on the order of nanometers is formed on the transparent resin layer 321, and process parameters and thicknesses of all transparent inorganic insulating layers 322 are the same generally. The transparent resin layer 321 may be fabricated by using an acrylic resin material, a uniform-thickness film layer may not be formed by directly applying a black resin material to the acrylic resin material, problems such as local material aggregation may occur, and thus, adding the transparent inorganic insulating layer 322 on the transparent resin layer 321 can guarantee the film formation uniformity of the light shading layers 31 formed thereon.

Optionally, in the line recognition module provided by the embodiment of the present disclosure, a material of the transparent inorganic insulating layer 322 may be silicon nitride (NxSi) or silicon oxynitride (NOxSi) formed by low temperature chemical vapor deposition.

Specifically, the temperature used for the low-temperature chemical vapor deposition is approximately 80° C. Since the light shading layers 31 and the transparent resin layer 321 are fabricated at a low temperature, forming the transparent inorganic insulating layer 322 by a low temperature chemical vapor deposition method can avoid damage to patterns of the underlying light shading layer 31 and the transparent resin layer 321 in a high temperature environment.

Figure 6:
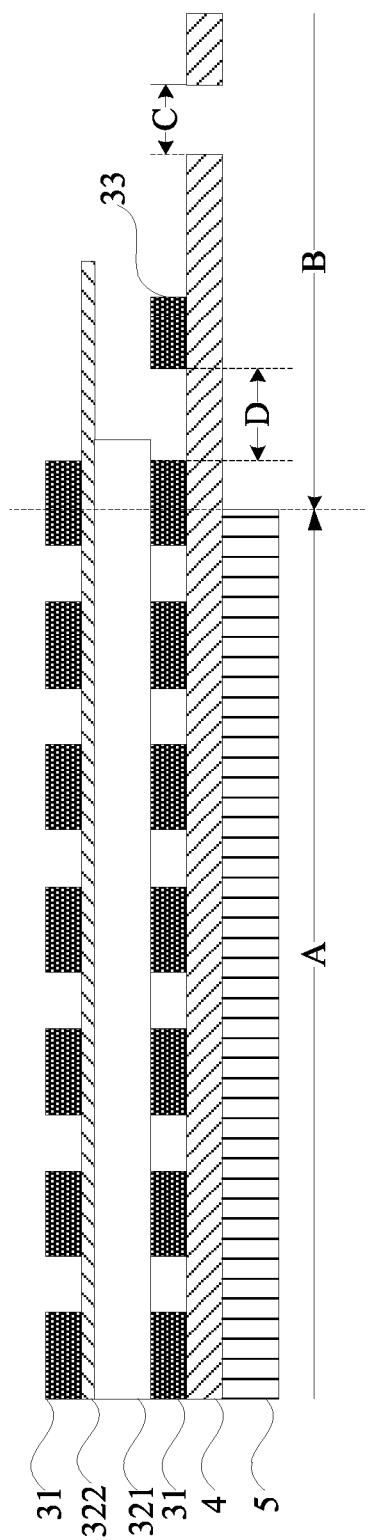
FIG. 6 is another schematic structural diagram of a line recognition module provided by an embodiment of the present disclosure.

Optionally, in the line recognition module provided by the embodiment of the present disclosure, as shown in FIG. 6, the light shading layers 31 may extend from the line recognition area A to an adjoining edge of the peripheral area B, i.e., an area covered by the light shading layers 31 is larger than the line recognition area A to ensure that stray light entering the optical sensing structure 2 from the peripheral area B may be blocked. An orthographic projection of the transparent resin layer 321 onto the substrate 1 should completely cover an orthographic projection of the light shading layer 31 contiguous with the transparent resin layer 321 onto the substrate 1. Due to fluidity of the resin material when actually made, the finally-formed transparent resin layer 321 will overflow from an edge of the light shading layer 31, and thus, in order to guarantee the uniformity of a thickness of the subsequently-formed light shading layer 31 at the edge position, an orthographic projection of the transparent inorganic insulating layer 322 formed on the transparent resin layer 321 onto the substrate 1 should completely cover and be larger than an orthographic projection of the transparent resin layer 321 continuous with the transparent inorganic insulating layer 322 onto the substrate 1.

Figure 7:
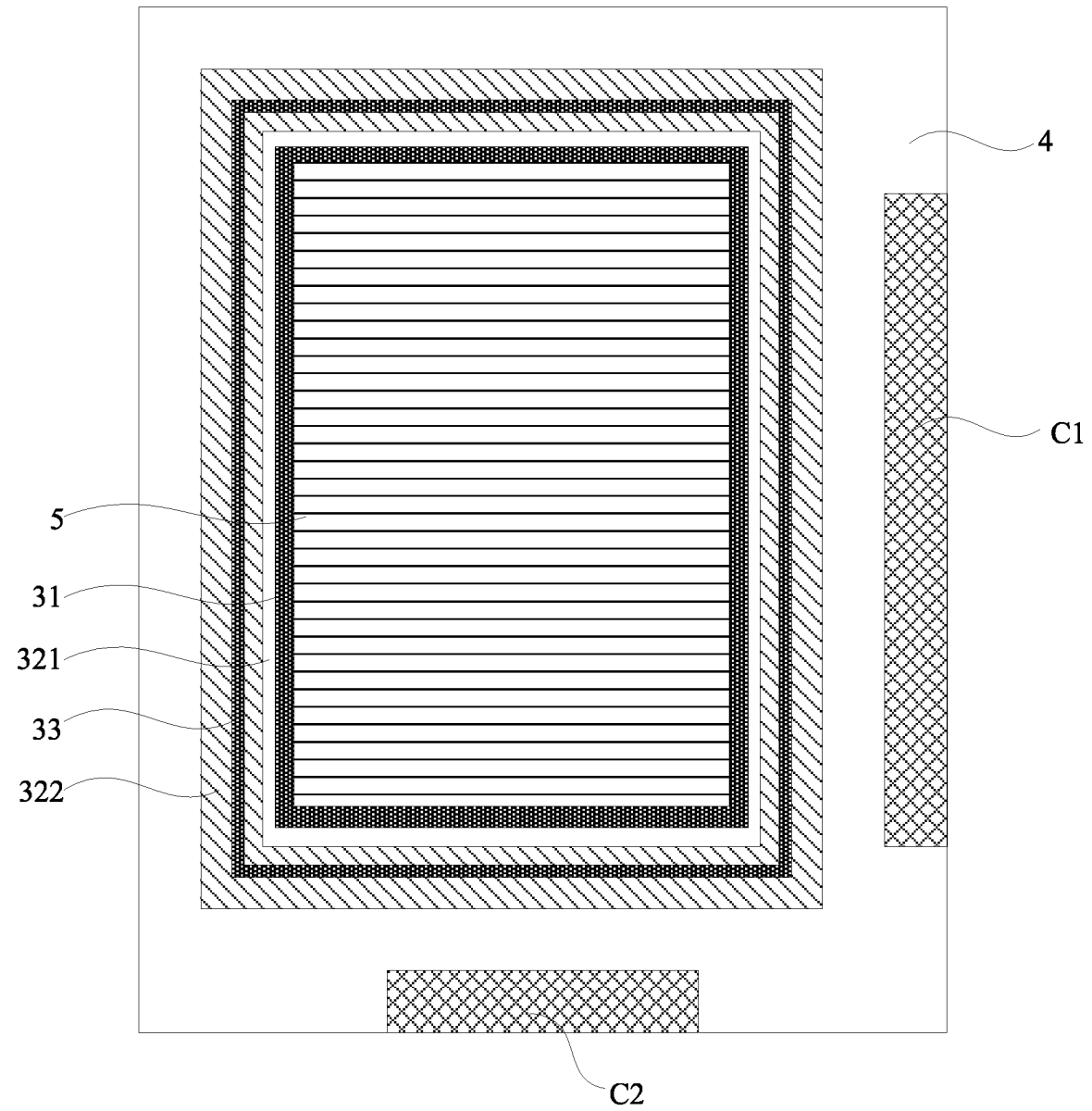
FIG. 7 is a schematic top view of a line recognition module provided by an embodiment of the present disclosure.

Optionally, in the line recognition module provided by the embodiment of the present disclosure, as shown in FIGS. 6 and 7, the collimating structure 3 may further include a retaining wall structure 33 disposed around the transparent resin layer 321 and disposed independently on the same layer as the light shading layer 31 contiguous with the transparent resin layer 321.

Specifically, while fabricating the light shading layers 31, the retaining wall structure 33 arranged around the light shading layers 31 by one circle is made at an interval from the periphery of the light shading layers 31, a gap between the light shading layers 31 and the retaining wall structure 33 acts as an edge overflow area D for the subsequent transparent resin layer 321, the retaining wall structure 33 may stop an edge of the transparent resin layer 321 from overflowing out of the retaining wall structure 33 when the light shading layers 31 are subsequently coated with a material of the transparent resin layer 321 with certain fluidity. Further, since edge overflow may exist when each transparent resin layer 321 is fabricated, the retaining wall structure 33 may be fabricated while other light shading layers 31, except for the light shading layer 31 that was fabricated last, may be fabricated.

Optionally, the line recognition module provided by the embodiments of the present disclosure, as shown in FIGS. 1 and 2, may further include: a planarization layer 4 located between the collimating structure 3 and the optical sensing structure 2, where the planarization layer 4 is arranged in an intact surface manner and having a hollow-out pattern only in the bonding area C.

Specifically, after the fabrication of the optical sensing structure 2 is completed, the planarization layer 4 is first fabricated. On the one hand, subsequent formation of the collimating structure 3 thereon is facilitated, and on the other hand, the planarization layer 4 may function as protecting a film layer under it. The planarization layer 4 is arranged with the hollow-out pattern in the bonding area C to expose the bonding electrodes 7 for subsequent binding of the drive chip. The hollow-out patterns may be specifically arranged in a one-to-one correspondence with each bonding electrode 7, or only one hollow-out pattern may be arranged in the entire bonding area C, which is not limited here.

Optionally, in the line recognition module provided by the embodiment of the present disclosure, the planarization layer 4 is typically made of an inorganic insulating material, e.g., silicon oxide ($SiO_2$) or silicon nitride (SiN) material. Silicon nitride is good in film formation compactness and is advantageous for uniformity of film formation of the first light shading layer 31 on the planarization layer 4 in the collimating structure 3, and meanwhile ITO may be better protected against the influence of etching solution when the first light shading layer is etched. Since each film layer of the optical sensing structure 2 is formed using a high temperature process, the planarization layer 4 may also be formed using a high temperature process without damaging the underlying film layer. Specifically, the planarization layer 4 may be fabricated by using plasma enhanced chemical vapor deposition (PECVD) equipment at a temperature around 230° C.

Figure 3C:
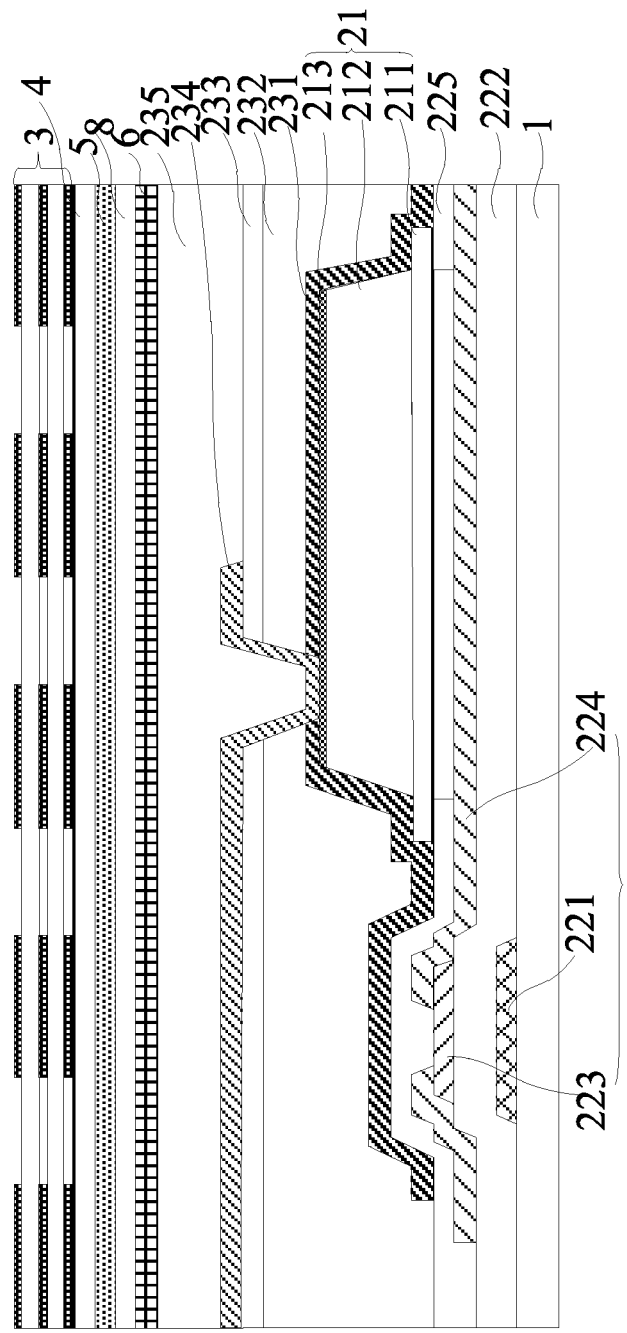
FIG. 3C is another schematic structural diagram of one optical sensor in a line recognition module provided by an embodiment of the present disclosure.
Figure 3D:
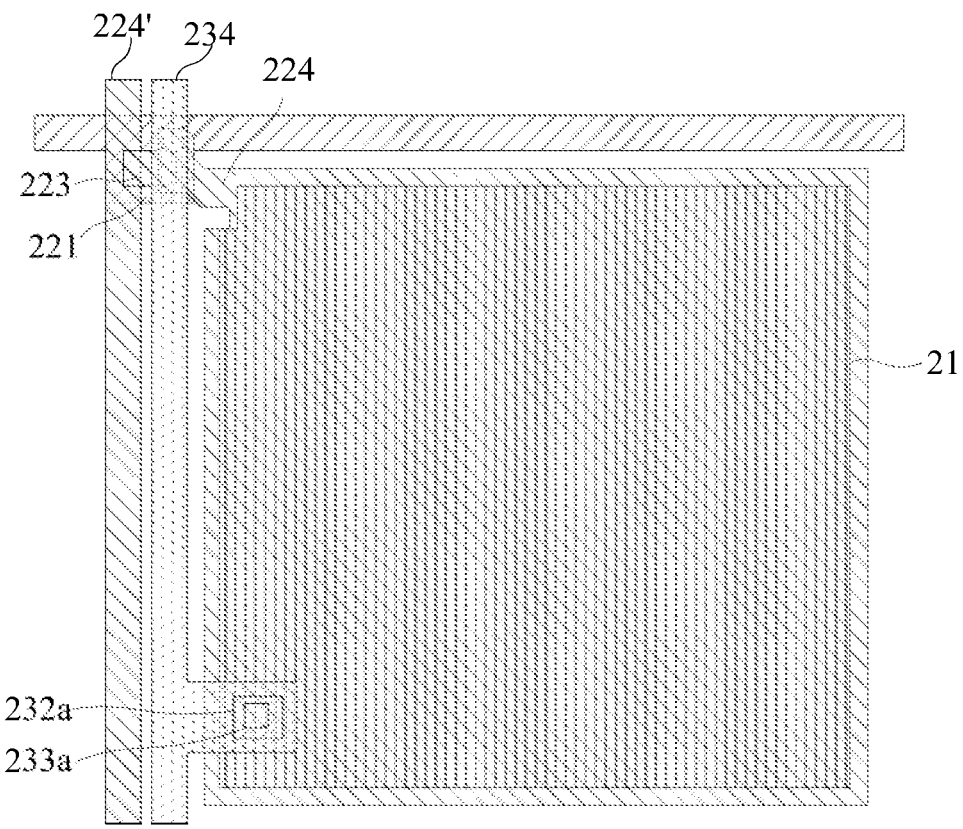
FIG. 3D is a schematic top view of an optical sensor in a line recognition module provided by an embodiment of the present disclosure.

Optionally, the line recognition module provided by the embodiment of the present disclosure, as shown in FIGS. 3A to 3C, may further include: a grounded shield layer 5 located between the planarization layer 4 and the optical sensing structure 3. The grounded shield layer 5 is contiguous with the planarization layer 4 and a pattern of the grounded shield layer 5 is covered by the pattern of the planarization layer 4, and an orthographic projection of the grounded shielded layer 5 onto the substrate 1 covers an orthographic projection of the optical sensing structure 2 onto the substrate 1. Specifically, the grounded shield layer 5 covers an entire fingerprint recognition area, or the grounded shield layer 5 covers a photosensitive area.

Specifically, as shown in FIG. 6, the whole grounded shield layer 5 is generally arranged in the line recognition area A, functions as shielding electromagnetic interference from the outside optical sensing structure 2, and is generally made of the ITO in order to guarantee transmittance. The planarization layer 4 completely covers the grounded shield layer 5, serving to protect the grounded shield layer 5, and preventing the situation that the grounded shield layer 5 is exposed to a hydrogen-rich environment to displace indium ions out of the ITO by hydrogen gas during subsequent fabrication of the film layers of the collimating structure 3 in the chemical vapor deposition equipment, which results in fogging of the grounded shield layer 5 and affecting the transmittance.

Figure 8A:
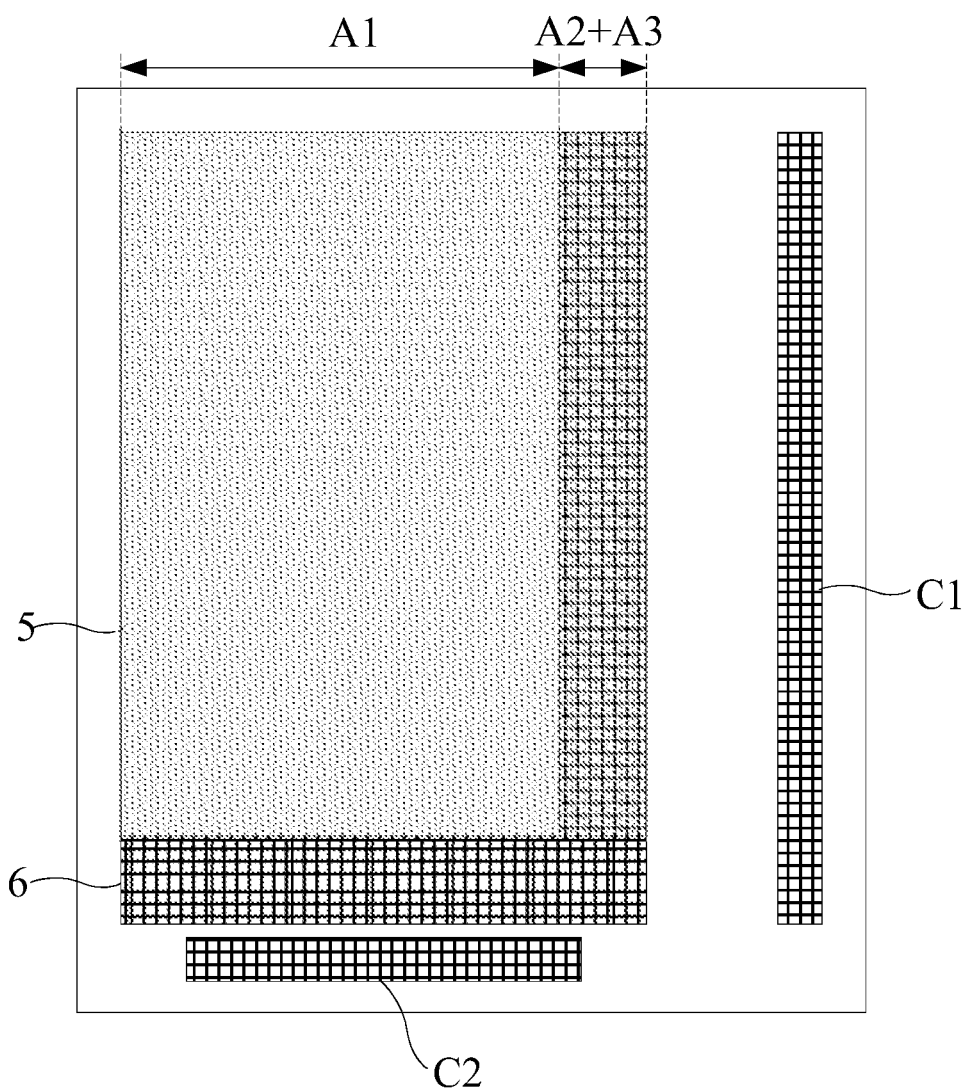
FIG. 8A is another schematic top view of a line recognition module provided by an embodiment of the present disclosure.
Figure 8B:
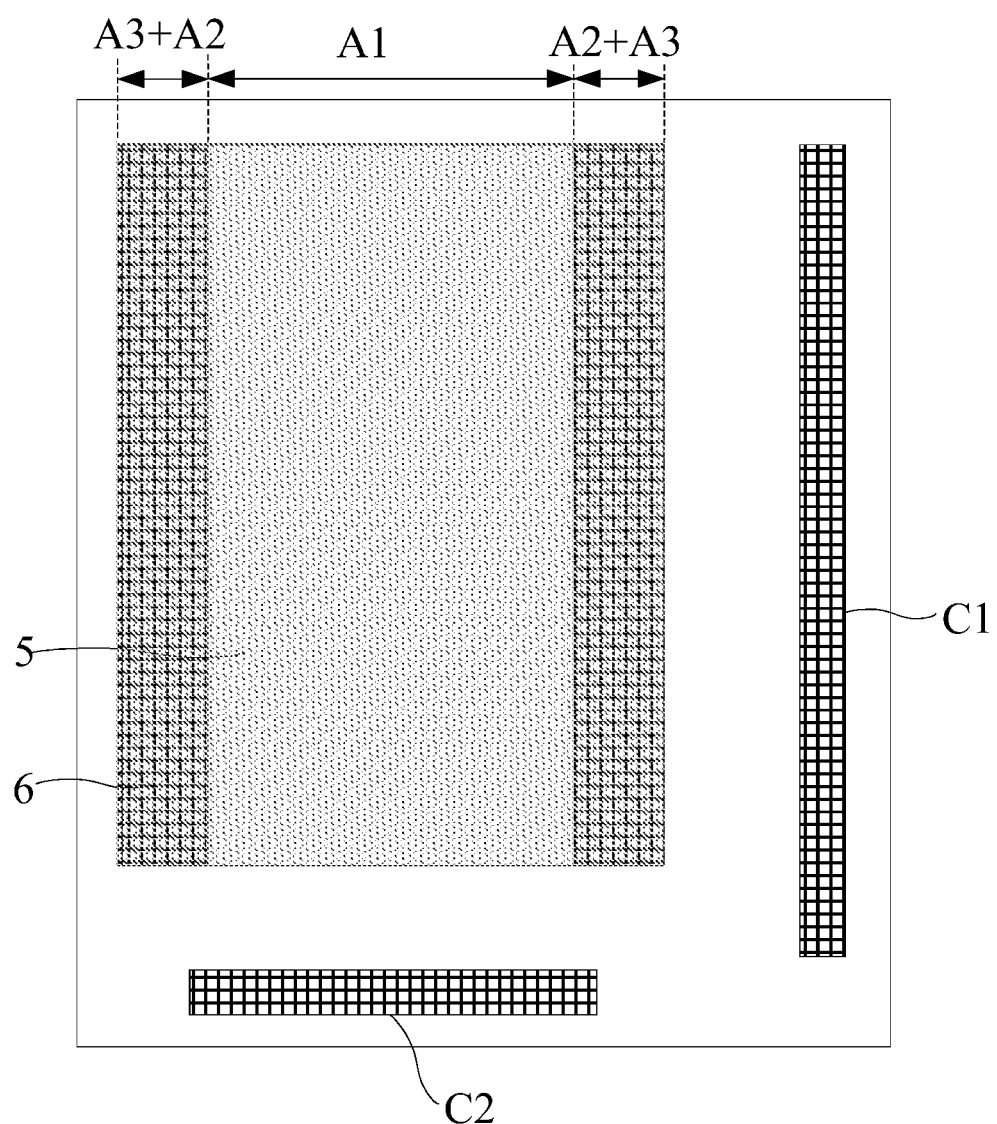
FIG. 8B is another schematic top view of a line recognition module provided by an embodiment of the present disclosure.
Figure 9:
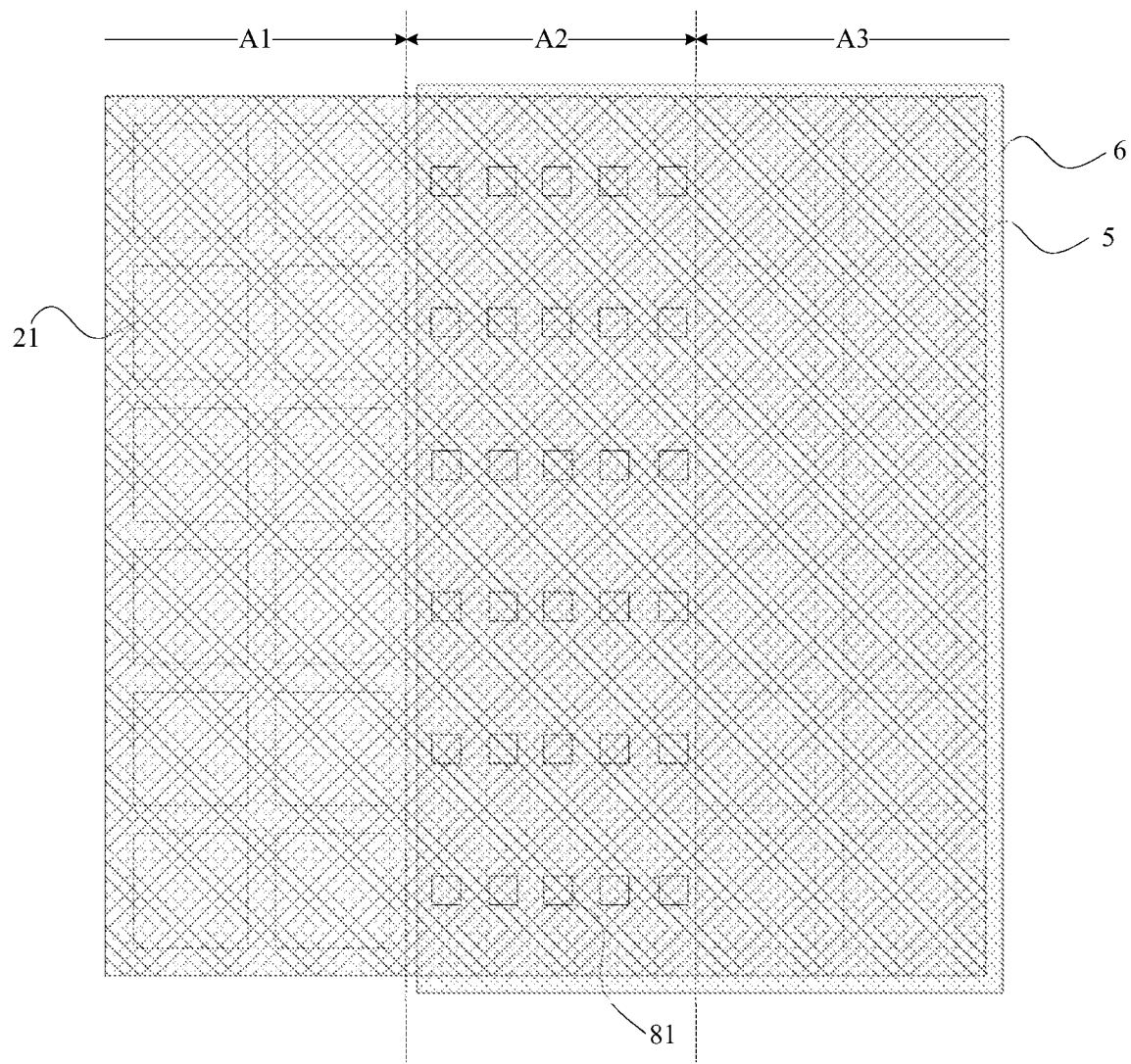
FIG. 9 is a schematic partial top view of a line recognition area in a line recognition module provided by an embodiment of the present disclosure.

Optionally, the line recognition module provided by the embodiment of the present disclosure, as shown in FIG. 6, may further include: a noise reduction metal layer 6 between the grounded shield layer 5 and the optical sensing structure 2. As shown in FIGS. 8A, 8B, and 9, the line recognition area A is divided into a photosensitive area A1, an interval area A2, and a light shading area A3, where the interval area A2 is located between the photosensitive area A1 and the light shading area A3. Optical sensing structures 2 are disposed in the photosensitive area A1 and the light shading area A3 without a pattern disposed in the interval area A2, and a plurality of optical sensors 21 arranged in an array in the photosensitive area A1 and the light shading area A3 are shown as blocks in FIG. 9. The noise reduction metal layer 6 covers only the interval area A2 and the light shading area A3, and the grounded shield layer 5 covers the photosensitive area A1, the interval area A2 and the light shading area A3. Namely, it can be assumed that the optical sensing structures 2 in the light shading area A3 and the photosensitive area A1 are the same and are distinguished by the addition of the noise reduction metal layer 6 at the light shading area A3. FIG. 3c shows the optical sensing structure in the light shading area A3 and FIG. 3A shows the optical sensing structure in the photosensitive area A1. Since it is not illuminated, a signal output by the optical sensor 21 of the light shading area A3 may serve as a noise signal (electrical signal noise) to de-noise a signal output by the photosensitive area A1, and in general, a reading chip performs data reading with 32 columns of optical sensors 21 as a cycle, so an integer multiple of 32 columns of optical sensors 21 may be arranged at the light shading region A3 to facilitate de-noising treatment. No optical sensors 21 are arranged within the interval area A2 arranged between photosensitive area A1 and the light shading area A3, and the interval area A2 may generally be arranged at an interval of at least 2 columns of optical sensors 21, so as to avoid mutual interference between the signal of the photosensitive area A1 and the signal of the light shading area A3.

Optionally, in the line recognition module provided by the embodiment of the present disclosure, as shown in FIGS. 8A and 8B, the light shading area A3 may be located on one side or light shading areas A3 may be located on two opposite sides of the photosensitive area A1, e.g., the light shading area A3 may be disposed on a side of the photosensitive area A1 near a gate drive chip bonding area C1, and/or the light shading area A3 may be disposed on a side of the photosensitive area A1 away from the gate drive chip bonding area C1, or the light shading areas A3 may be disposed on both sides of the photosensitive area A1, or the light shading area A3 may be disposed on a side of the photosensitive area A1 close to a data drive chip bonding area C2, and/or the light shading area A3 may be disposed on a side of the photosensitive area A1 away from the data drive chip bonding area C2.

Specifically, an orthographic projection of the noise reduction metal layer 6 arranged between the grounded shield layer 5 and the optical sensing structure 2 onto the substrate 1, as shown in FIG. 8A, may be located on the side of the line recognition area A adjacent to the bonding area C to reduce noise interference between the optical sensing structure 2 and the drive chip bound to the bonding area C. In FIG. 8A, the bonding area C includes the gate drive chip bonding area C1 on the right side of the line recognition area A and the data drive chip bonding area C2 on the lower side of the line recognition area A, and a pattern of the noise reduction metal layer 6 is arranged on the right side and the lower side of the line recognition area A. A schematic diagram of the light shading layers A3 on both left and right sides respectively is shown in FIG. 8B.

Figure 10D:
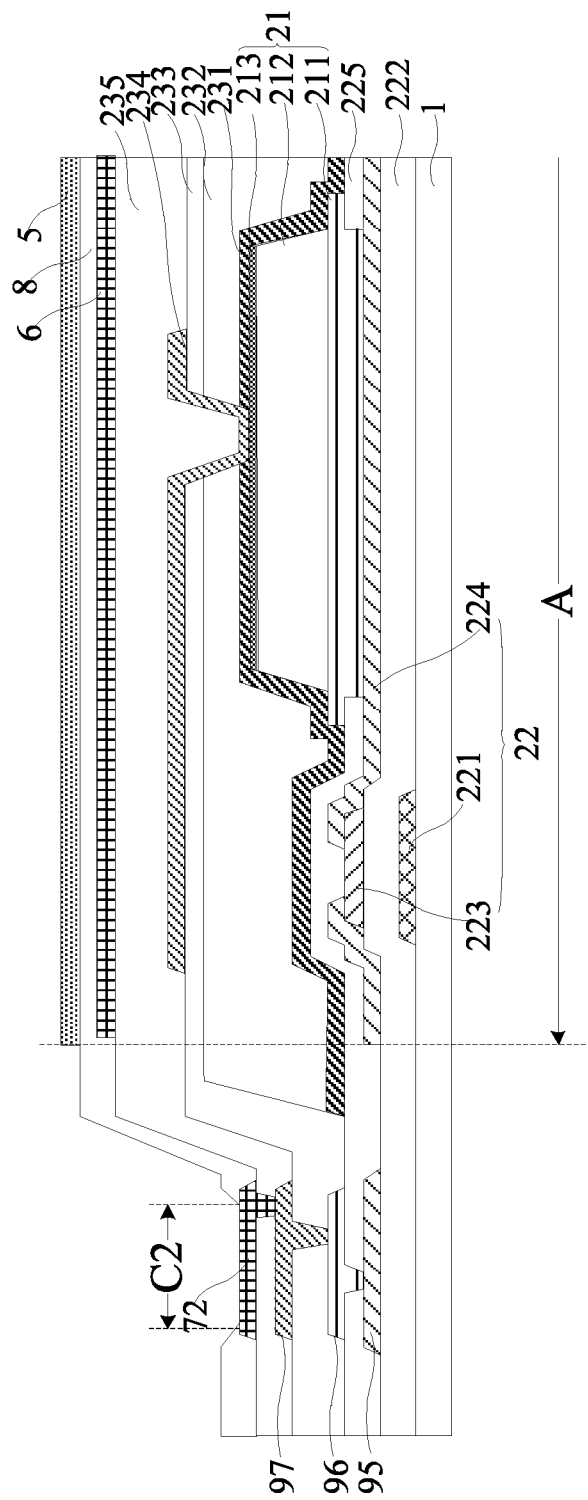
FIG. 10D is another schematic structural diagram of a line recognition module provided by an embodiment of the present disclosure.

Optionally, the line recognition module provided by the embodiment of the present disclosure, as shown in FIGS. 10A, 10B, and 10D, may further include: a third insulating layer 8 between the grounded shield layer 5 and the noise reduction metal layer 6. As shown in FIG. 9, within the interval area A2, the noise reduction metal layer 6 is electrically connected with the grounded shield layer 5 through a plurality of through holes 81 penetrating through the third insulating layer 8, and the noise reduction metal layer 6 can be subjected to grounded processing so as to avoid interference with the signals read by the light shading layer A3 caused by a coupling capacitance between them.

Optionally, the line recognition module provided by the embodiment of the present disclosure, as shown in FIGS. 10A to 10E, may further include: the bonding electrode 7 located within the bonding area C, where the bonding electrode 7 is arranged on the same layer as the noise reduction metal layer 6. Compared to the mode that a bonding electrode 7 is made of ITO on a same layer as a grounded shield layer 5, as shown in FIGS. 10A, 10B, 10D and 10E, the bonding electrode 7 in the present disclosure is fabricated at the same time as the noise reduction metal layer 6, i.e., the bonding electrode 7 is made of a metal material instead of ITO, so the pattern of the grounded shield layer 5 and a pattern of the bonding electrode 7 do not coincide with each other. The situation that the bonding electrode 7 made of the ITO material is exposed to a hydrogen-rich environment to affect its electrical performance during subsequent fabricating of the film layers of the collimating structure 3 in the chemical vapor deposition equipment is avoided.

Figure 8C:
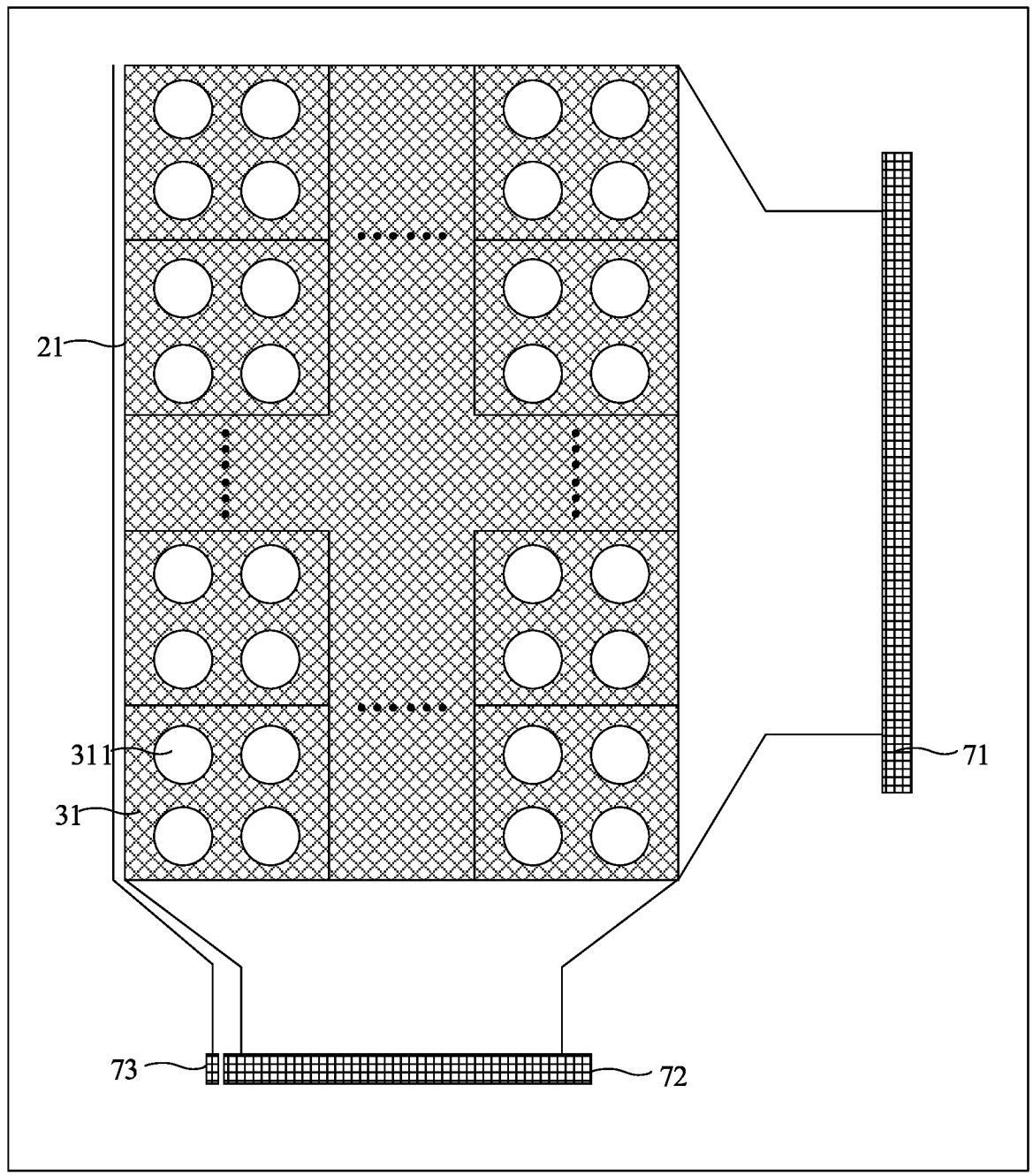
FIG. 8C is another schematic top view of a line recognition module provided by an embodiment of the present disclosure.

Specifically, the gate drive chip bonding area C1 on the right side of the line recognition area A is generally configured to bind a gate drive chip, and the data drive chip bonding area C2 on the lower side of the line recognition area A is generally configured to bind a data drive chip or is called a data reading chip. For convenience of description, as shown in FIG. 8C, the bonding electrode 7 located within the gate drive chip bonding area C1 is referred to as a first bonding electrode 71, and the bonding electrodes 7 located within the data drive chip bonding area C2 are referred to as a second bonding electrode 72 and a third bonding electrodes 73. The first bonding electrode 71 is configured to provide a signal for the gate 221, the second bonding electrode 72 is configured to be connected with the source-drain layer 224, and the third bonding electrode 73 is configured to provide a signal for the bias voltage line 234.

In order to facilitate the connection of different types of bonding electrodes 7 with corresponding components, corresponding connection electrodes may be arranged below the bonding electrodes 7 to film layers where a the components to be connected are located. For example, as shown in FIGS. 10A and 10B for the first bonding electrode 71, a first connection electrode 91 located on a film layer on which the gate 221 is located, a second connection electrode 92 located on the source-drain layer 224, a third connection electrode 93 located on a film layer on which the first electrode 211 is located, and a fourth connection electrode 94 located on the bias voltage line 234 are arranged between the first bonding electrode 71 and the substrate 1. The first bonding electrode 71 is electrically connected with the second connection electrode 92 by a first via hole 222a penetrating through the gate insulating layer 222, the second connection electrode 92 is electrically connected with the third connection electrode 93 by a second via hole 225a penetrating through the first insulating layer 225, the third connection electrode 93 is electrically connected with the fourth connection electrode 94 by a third via hole 233a penetrating through the second insulating layer 233, the fourth connection electrode 94 is electrically connected with the first bonding electrode 71 by a fourth via hole 8a penetrating through the third insulating layer 8, and the first bonding electrode 71 is electrically connected with the gate 221 through a gate line and a gate line fan-out routing wire.

As shown in FIG. 10C, the number of first via holes 222a, the number of second via holes 225a and the number of third via holes 233a corresponding to one first bonding electrode 71 are each at least two. Orthographic projections of the first via holes 222a, the second via holes 225a and the third via holes 233a on the substrate 1 do not overlap one another and are arranged alternately in an extension direction of the first bonding electrode 71. One first bonding electrode 71 corresponds to one fourth via hole 8a, an orthographic projection of the fourth via hole 8a on the substrate 1 simultaneously covers the first via holes 222a, the second via holes 225a and the third via holes 233a. Specifically, disposing the plurality of first via holes 222a, the second plurality of via holes 225a, and the plurality of third via holes 233a may improve connection yield as well as reduce resistance, and staggered arrangement of the first via holes 222a, the second via holes 225a, and the third via holes 233a may improve the connection yield. Further, implementations in which the via holes overlap or partially overlap one another, as shown in FIG. 10B, are also within the protection scope of the present disclosure.

Similarly, as shown in FIG. 10D, for the second bonding electrode 72, a fifth connection electrode 95 located on the source-drain layer 224, a sixth connection electrode 96 located on a film layer where the first electrode 213 is located, and a seventh connection electrode 97 located on the bias voltage line 234 are arranged between the second bonding electrode 72 and the substrate 1. The seventh connection electrode 97 is electrically connected with the source-drain layer 224 through a data line and a data line fan-out routing wire. Similar to the connection relationship of the first bonding electrode 71 and the corresponding connection electrodes, a plurality of corresponding via holes may also be formed in a staggered manner, and detailed description is omitted here.

Figure 10E:
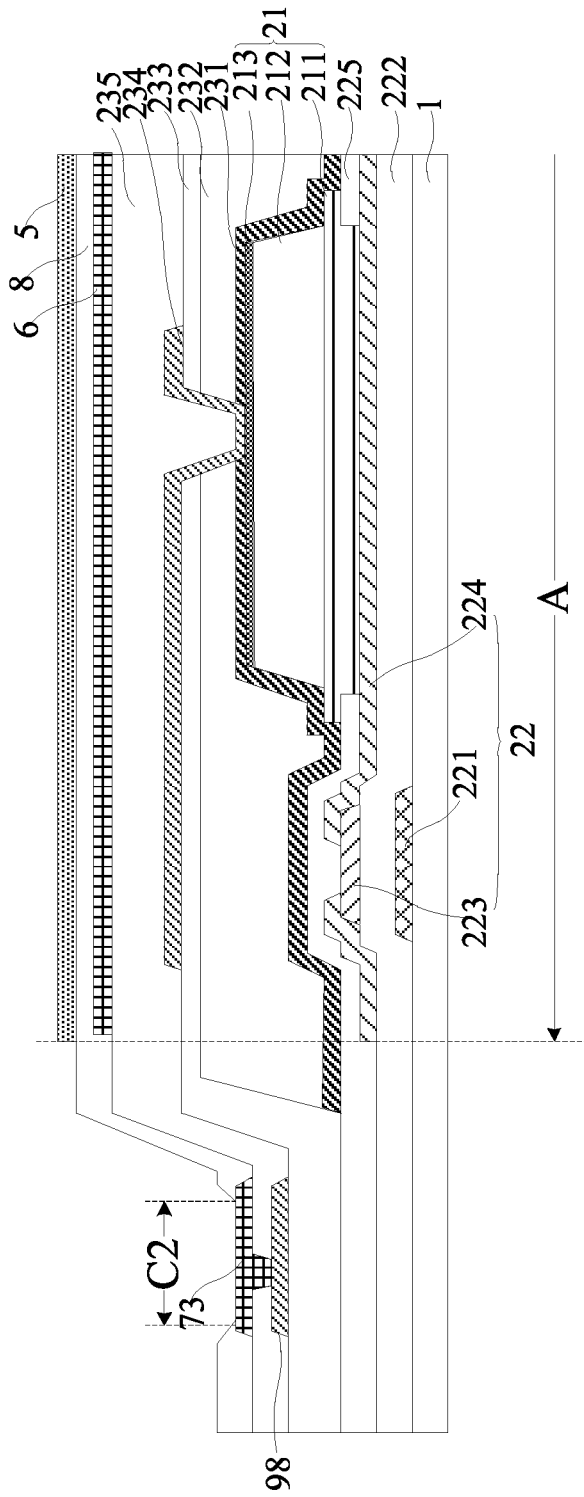
FIG. 10E is another schematic structural diagram of a line recognition module provided by an embodiment of the present disclosure.

As shown in FIG. 10E, the third bonding electrode 73 is generally located at one side edge of the data drive chip bonding area C2, an eighth connection electrode 98 located on the bias voltage line is arranged between the third bonding electrode 73 and the substrate 1, and the eighth connection electrode 98 is electrically connected with the bias voltage line 234 through a bias voltage signal line and a bias voltage fan-out routing wire.

Specifically, alignment marks shaped like "+" may further be made at four corners of the film layer on which the noise reduction metal layer 6 is located, and the alignment marks are used for alignment during subsequent making of all the film layers in the collimating structure 3.

Specifically, in order to improve the electrical properties of the bonding electrode 7, materials of the noise reduction metal layer 6 and the bonding electrode 7 may be changed from a common molybdenum (MO) material to a titanium/aluminium/titanium (Ti/Al/Ti) material when the bonding electrode 7 and the grounded shied layer 5 are fabricated simultaneously.

Figure 11:
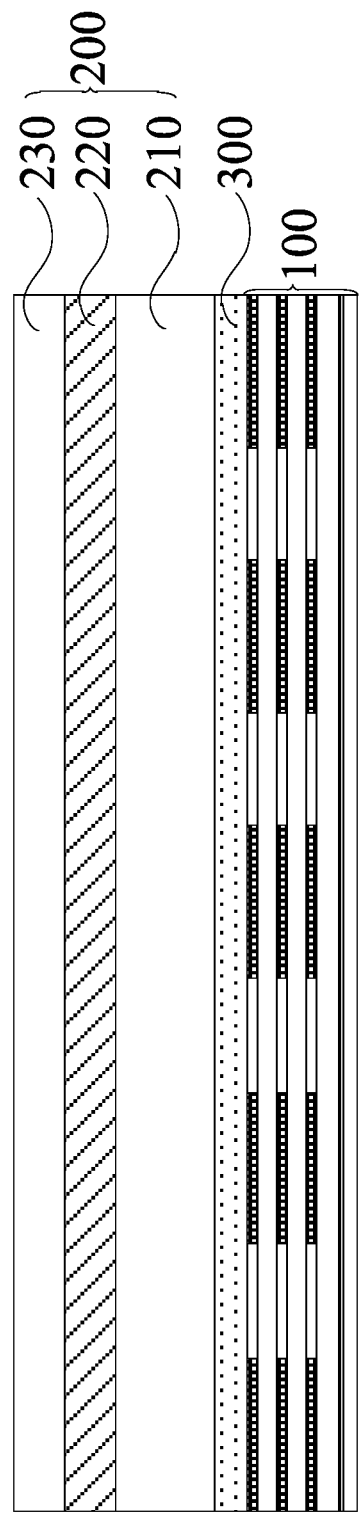
FIG. 11 is a schematic structural diagram of a display device provided by an embodiment of the present disclosure.

Based on the same inventive concept, an embodiment of the present disclosure provides a display device. As shown in FIG. 11, the display device includes the line recognition module 100 provided by the embodiment of the present disclosure and a display panel 200 located on the line recognition module 100. The display panel 200 and the line recognition module 100 are secured by optically clear adhesive (OCA) 300.

Specifically, in the display device provided by the embodiment of the present disclosure, at least two light shading layers 31 and a light transmitting layer 32 with relatively simple structures are formed directly after an optical sensing structure 2 is fabricated on a substrate 1 in the line recognition module 100 to achieve a better collimation effect, and a device is light and thin in structure, which can reduce the difficulty of processing the device. The problem that the yield is affected due to blistering caused by adopting optically clear adhesive (OCA) for attaching a collimating structure to the line recognition module 100 is avoided. Moreover, since film layers are fabricated directly on the optical sensing structure 2 to form the collimating structure 3, fabrication of the collimating structure 3 may be accomplished by using general equipment for fabrication of the film layers on an array substrate without adding new fabrication equipment.

Optionally, in the display device provided by the embodiment of the present disclosure, as shown in FIG. 11, the display panel 200 may be an Organic Light Emitting Diode (OLED) display panel, a Quantum Dot Light Emitting Diodes (QLED) display panel, or the like, and the embodiment of the present disclosure does not make particular limitations thereto. The OLED display panel may be, for example, a flexible OLED display panel. For example, the OLED display panel and the QLED display panel have self-luminous properties, and light emission of display pixel units thereof can also be controlled or modulated as needed, thereby providing convenience for line acquisition and contributing to improve the integration of the device.

The OLED display panel generally includes a flexible OLED display backplane 210, a polarizer 220, and a protective cover plate 230 disposed in sequence in a stacked manner. A material of the protective cover plate 230 may be polyimide (PI). A substrate of the flexible OLED display backplane 210 is a flexible substrate, and a specific material may be PI or other flexible materials.

Specifically, the OLED display panel can achieve flexible display. For example, a foldable screen that can be made as desired by a customer. Moreover, the protective cover plate 230 in the OLED display panel is made of a PI material, so the panel is light and thin which meets panel thickness requirements raised by the customer. For example, the required thickness of an ultra-thin foldable screen may be achieved, which takes a value in the range of 0.4 mm to 0.65 mm to meet the design requirements of the foldable screen.

Figure 12:
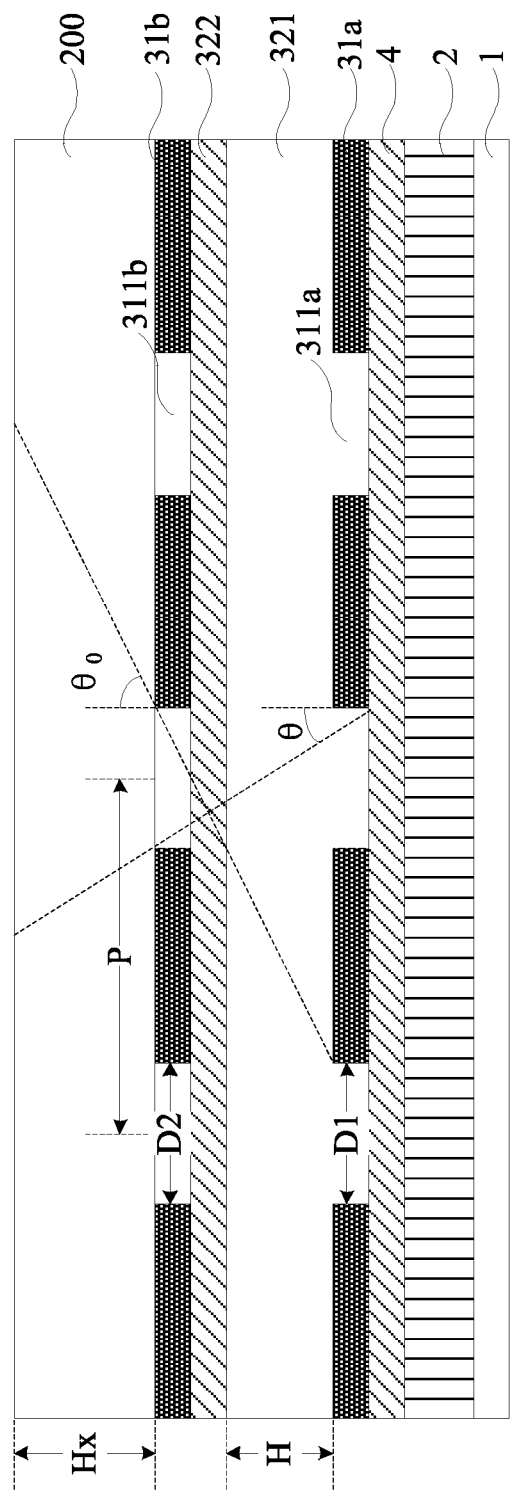
FIG. 12 is another schematic structural diagram of a display device provided by an embodiment of the present disclosure.

Optionally, in the display device provided by the embodiment of the present disclosure, as shown in FIG. 12, the collimating structure 3 in the line recognition module 100 may include two light shading layers 31 and one light transmitting layer 32, A distance between the two light shading layers 31 is used to determine a height of the collimating structure 3, and light transmitting holes in the light shading layers 31 are configured to determine a collimation light collection angle. Specifically, the collimating structure 3 includes a first light shading layer 31a, a transparent resin layer 321, a transparent inorganic insulating layer 322, and a second light shading layer 31b which are arranged in sequence in a stacked manner on the optical sensing structure 2 are included.

The first light shading layer 31a includes first light transmitting holes 311a arranged in an array, and the second light shading layer 31b includes second light transmitting holes 311b arranged in an array.

Specifically, centers of the light transmitting holes 311 in the two light shading layers 31 coincide, periods P of the light transmitting holes 311 are the same, and a specific size range is affected by a thickness of the OLED display panel thereon.

Optionally, in the display device provided by the embodiment of the present disclosure, an aperture D1 of each of the first light transmitting holes 311a may be equal to an aperture D2 of each of the second light transmitting holes 311b.

Figure 13:
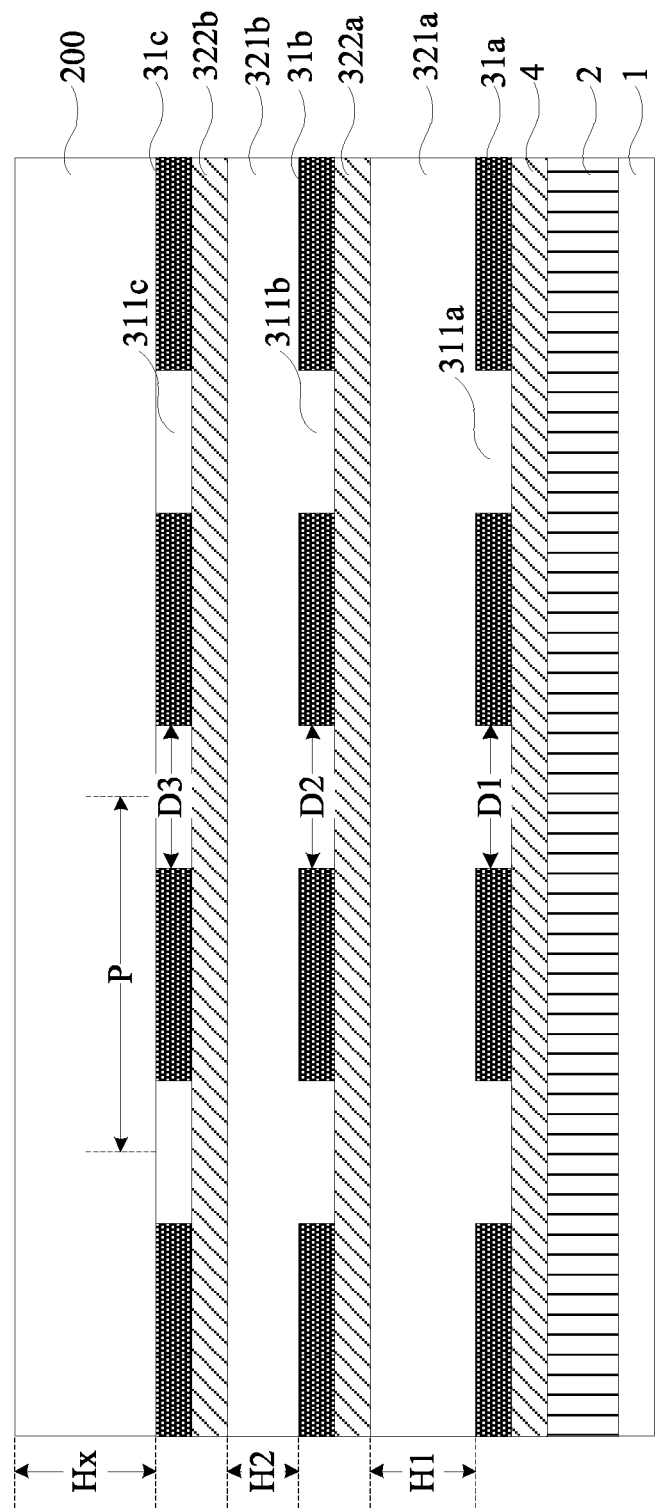
FIG. 13 is another schematic structural diagram of a display device provided by an embodiment of the present disclosure.

Specifically, as shown in FIG. 13, the collimation light collection angle in the display device satisfies the following relationship: $\tan\theta = D/H = C_{min}/2H_x$, where a finger valley-ridge interval Cmin is 0.3 mm to 0.45 mm, and periods P of the light transmitting holes 311 affect the transmittance of signal light received by each optical sensor PIN in the optical sensing structure as well as light ray crosstalk between adjacent light transmitting holes 311. A maximum light ray angle $\theta_0$ emitted by the OLED display panel also represents a maximum angle of light reflected by a finger, where $P = H/\tan\theta_0$.

Optionally, in the display device provided by the embodiment of the present disclosure, according to the thickness requirement of the ultrathin foldable screen, a thickness Hx of the OLED display panel may range from 0.4 mm to 0.65 mm. According to a process production capability and in order to guarantee the light and thin type of the display device, θ is in a range from 20° to 50°, $\theta_0$ is a fixed value of 70°, thus the aperture D1 of the first light transmitting holes 311a' is 2 µm to 10 µm, a value range of the periods P of the light transmitting holes 311 is influenced by Hx, therefore the periods of the first light transmitting holes 311a are 13 µm to 60 µm, and a thickness H of the transparent resin layer 321 is 5 µm to 30 µm.

Figure 14:
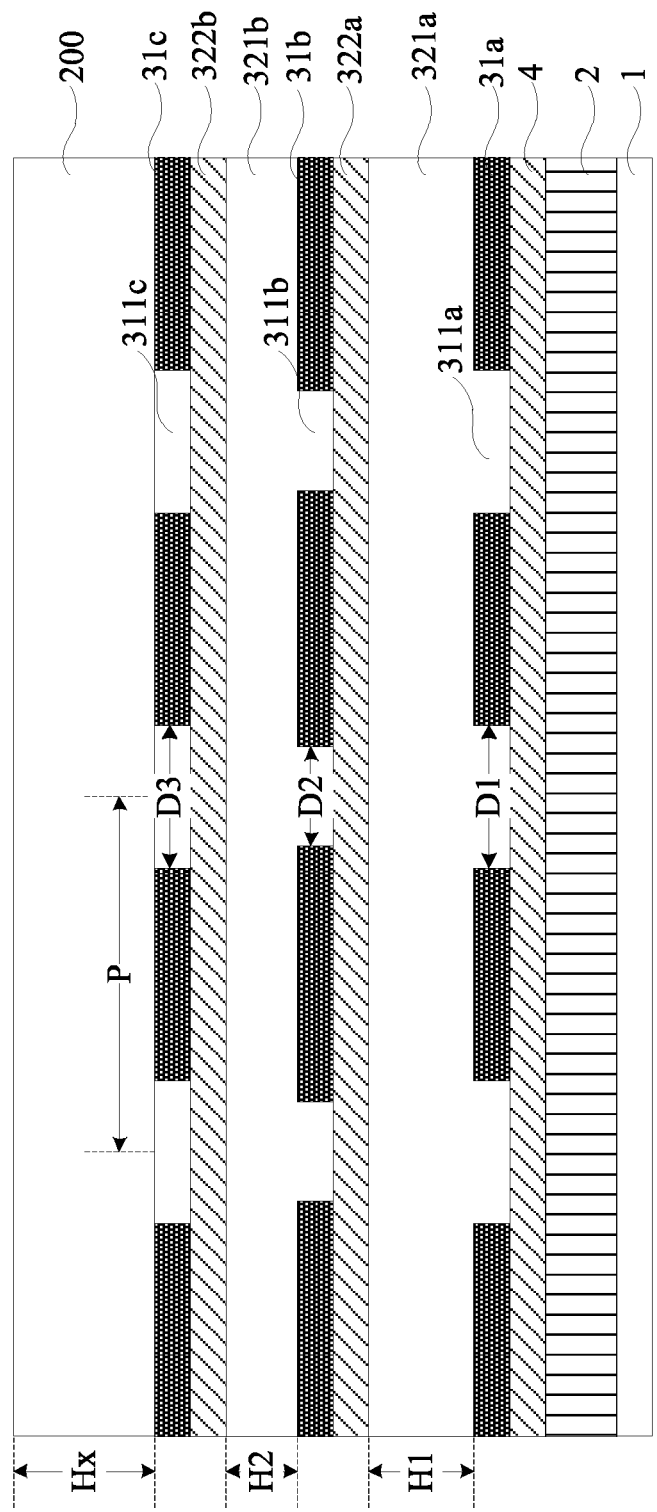
FIG. 14 is another schematic structural diagram of a display device provided by an embodiment of the present disclosure.

Optionally, in the display device provided by the embodiment of the present disclosure, as shown in FIGS. 13 and 14, the collimating structure 3 in the line recognition module 100 may include three light shading layers 31 and two light transmitting layers 32, specifically including a first light shading layer 31a, a first transparent resin layer 321a, a first transparent inorganic insulating layer 322a, a second light shading layer 31b, a second transparent resin layer 321b, a second transparent inorganic insulating layer 322b, and a third light shading layer 31c disposed in sequence in a stacked manner on the optical sensing structure 2.

The first light shading layer 31a includes first light transmitting holes 311a arranged in an array, the second light shading layer 31b includes second light transmitting holes 311b arranged in an array, and the third light shading layer 31c includes third light transmitting holes 311c arranged in an array.

Specifically, the centers of the light transmitting holes 311 in the three light shading layers 31 coincide, the periods of the light transmitting holes 311 are the same, and a specific size range is affected by the thickness of the OLED display panel thereon.

Figure 15:
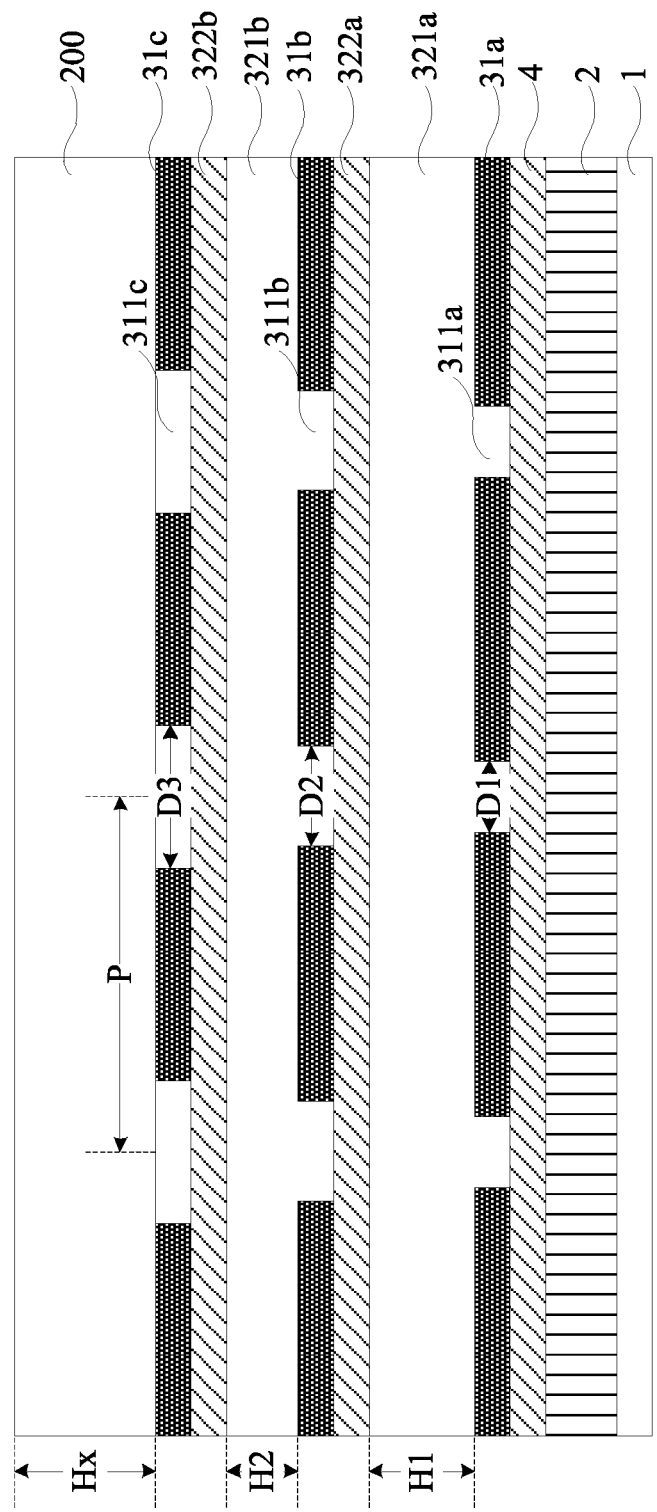
FIG. 15 is another schematic structural diagram of a display device provided by an embodiment of the present disclosure.

Optionally, in the display device provided by the embodiment of the present disclosure, as shown in FIGS. 13 to 15, the apertures D1 of the first light transmitting holes 311a may be greater than or equal to the apertures D3 of the third light transmitting holes 311c. The thickness H1 of the first transparent resin layer 321a may be larger than the thickness H2 of the second transparent resin layer 321b so that the second light shading layer 31b is closer to the third light shading layer 31c, enhancing the effect of reducing light ray crosstalk between the adjacent light transmitting holes.

Optionally, in the display device provided by the embodiment of the present disclosure, the apertures D2 of the second light transmitting holes 311b may be equal to the apertures D1 of the first light transmitting holes 311a as shown in FIG. 13, or the apertures D2 of the second light transmitting holes 311b may be 50% to 80% of the apertures D1 of the first light transmitting holes 311a as shown in FIG. 14, and light ray crosstalk between the adjacent light transmitting holes may be further weakened. Alternatively, as shown in FIG. 15, the apertures of the third light transmitting holes 311c, the second light transmitting holes 311b, and the first light transmitting holes 311a may be disposed in a sequentially increasing manner.

Optionally, in the display device provided by the embodiment of the present disclosure, according to the thickness requirement of the ultrathin foldable screen, the OLED display panel may have a thickness Hx ranging from 0.4 mm to 0.65 mm, the value range of the periods P of the light transmitting holes 311 is affected by Hx, the periods of the first light transmitting holes 311a range from 10 µm to 40 µm, the apertures of the first light transmitting holes 311a may range from 3 µm to 8 µm according to the requirement of the desired collimation light collection angle, a thickness of the first transparent resin layer 321a ranges from 10 µm to 15 µm, and a thickness of the second transparent resin layer 321b ranges from 8 µm to 12 µm.

Specifically, when the collimating structure 3 employs the three light shading layers 31 and the two light transmitting layers 32, after the fabricating process of the optical sensing structure is ended, a planarization layer 4 made of material SiN or $SiO_2$ with a thickness of 800 angstroms to 8000 angstroms may be fabricated on the optical sensing structure for planarization purpose. Then the black first light shading layer 31a, e.g., a film layer with a thickness of 500 angstroms to 16000 angstroms using a BM resin material, is made on the planarization layer, and then the light transmitting holes 311a with the apertures D1 of 3 µm to 8 µm are formed by using photolithography or nanoimprinting. The periods P, i.e., interval value of adjacent light transmitting holes 311a, are 10 µm to 40 µm. The first transparent resin layer 321a with the thickness H1 of 10 µm to 15 µm covering the first light shading layer 31a in its entire surface is then fabricated on the first light shading layer 31a. Next, the first transparent inorganic insulating layer 322a is fabricated, the second light shading layer 31b is fabricated with the aperture D2 of the second light transmitting holes 311b being 3 µm to 8 µm, the second transparent resin layer 321b is fabricated with the thickness H2 being 8 µm to 12 µm, and then the second transparent inorganic insulating layer 322b and the third light shading layer 31c are fabricated with the apertures D3 of the third light transmitting holes 311c being 3 µm to 8 µm. Specifically, a specific value of P may be 18 µm, a specific value of H1 may be 15 µm, and a specific value of H2 may be 10 µm. D1=D2=D3, which may be 4 µm, or D1=D3, which may be 4 µm, and D2 is 20% to 50% less than the value of D1 and may be 3 µm to 3.5 µm. Furthermore, the display device provided by the embodiment of the present disclosure is not limited to the structures of two or three light shading layers, the number of the light shading layers may be increased, such as four light shading layers or more, and detailed description is omitted here.

For example, the display device further includes a signal line (including a gate line, a data line, a detection line, etc.) for supplying an electrical signal (including a scan signal, a data signal, a detection signal, etc.), and for example, a light emitting state of a light emitting element may be controlled by a drive circuit to light up a sub-pixel. For example, the display panel further includes functional layers such as an encapsulation layer, a touch layer, etc., which may be referred to in the related art and will not be described further here.

The display device may be any product or component having a line recognition function, such as a mobile phone, a tablet PC, a display, or a laptop, etc., and the embodiment of the present disclosure does not make specific limitation thereto.

Based on the same inventive concept, an embodiment of the present disclosure further provides a fabricating method of the line recognition module, where the line recognition module includes a line recognition area and a peripheral area surrounding the line recognition area, and the peripheral area includes a bonding area. The fabricating method includes: a substrate is provided; optical sensing structures arranged in an array are formed on the substrate and within the line recognition area; and a collimating structure is formed on the optical sensing structures by using a low temperature process, where the collimating structure is at least within the line recognition area and does not cover the bonding area, the collimating structure includes at least two light shading layers disposed in a stacked manner and a light transmitting layer located between every two adjacent light shading layers, each of the light shading layers has light transmitting holes arranged in an array, the light transmitting holes in each of the light shading layers are in one-to-one correspondence, and at least part of orthographic projections of the light transmitting holes onto the substrate coincide.

Specifically, in the fabricating method provided by the embodiment of the present disclosure, a better collimating effect may be achieved only by fabricating the optical sensing structures on the substrate and then directly fabricating the at least two light shading layers and the light transmitting layer with relatively simple structures, and a device is light and thin in structure, which can reduce the difficulty of processing the device. The problem that the yield is affected due to blistering caused by adopting optically clear adhesive (OCA) for attaching the collimating structure to the line recognition module is avoided. Moreover, since film layers are fabricated directly on the optical sensing structures to form the collimating structure, fabrication of the collimating structure may be accomplished by using general equipment for fabrication of the film layers on an array substrate without adding new fabrication equipment.

Specifically, in the fabricating method provided by the embodiment of the present disclosure, the light shading layers in the collimating structure may be generally made of a material with a high light shading capability like black resin such as BM. Process parameters of all the light shading layers are generally the same. Specifically, a whole layer of the substrate is generally coated with a film layer during fabrication of the light shading layers, and then the light transmitting holes are formed by using photolithography or nanoimprinting.

Optionally, in the fabricating method provided by the embodiment of the present disclosure, forming the light transmitting layer in the collimating structure specifically includes: a transparent resin layer is formed on one of the light shading layers by an inkjet printing method; and a transparent inorganic insulating layer covering and larger than the transparent resin layer is formed on the transparent resin layer through a low temperature chemical vapor deposition method.

Specifically, the transparent resin layer and the transparent inorganic insulating layer in the light transmitting layer may be fabricated through equipment for fabricating a thin film encapsulation structure in the array substrate, i.e., the transparent inorganic insulating layer may be fabricated by using chemical vapor deposition (CVD) equipment for fabricating an inorganic thin film encapsulation layer, and the transparent resin layer may be fabricated by using inkjet printing (IJP) equipment for fabricating an organic thin film encapsulation layer. After the light shading layers are fabricated, the transparent resin layer may be formed first to ensure that a thickness required for the entire light transmitting layer 32 is generally on the order of micrometers, then the transparent inorganic insulating layer with a small thickness on the order of nanometers is formed on the transparent resin layer, and process parameters and thicknesses of all transparent inorganic insulating layers are the same generally. The transparent resin layer may be fabricated by using an acrylic resin material, a uniform-thickness film layer may not be formed by directly applying a black resin material to the acrylic resin material, problems such as local material aggregation may occur, and thus, adding the transparent inorganic insulating layer on the transparent resin layer can guarantee the film formation uniformity of the light shading layers formed thereon.

Specifically, in the fabricating method provided by the embodiment of the present disclosure, the collimating structure is formed by using a low temperature process. Specifically, a temperature used for the low temperature process is around 80° C. Since the light shading layers and the transparent resin layer are fabricated at a low temperature, forming the transparent inorganic insulating layer by the low-temperature chemical vapor deposition method may avoid damage to a pattern of the underlying light shading layer and the transparent resin layer in a high-temperature environment.

Optionally, the fabricating method provided by the embodiment of the present disclosure, prior to forming the collimating structure on the optical sensing structure, may further include: a noise reduction metal layer is formed on the optical sensing structure while a bonding electrode is formed in the bonding area; a grounded shield layer is formed on the bonding electrode and the noise reduction metal layer, and the grounded shield layer and the bonding electrode do not overlap each other; and a planarization layer is formed on the grounded shield layer by using plasma enhanced chemical vapor deposition, and the planarization layer is disposed on the substrate in an intact surface manner and has a hollow-out pattern only in the bonding area.

Specifically, the grounded shield layer is generally arranged on the line recognition area in entire surface, functions as shielding electromagnetic interference from the outside optical sensing structure, and is generally made of ITO in order to guarantee transmittance. The planarization layer completely covers the grounded shield layer, serving to protect the grounded shield layer, and preventing the situation that the grounded shield layer is exposed to a hydrogen-rich environment to displace indium ions out of the ITO by hydrogen gas during subsequent fabrication of the film layers of the collimating structure in the chemical vapor deposition equipment, which results in fogging of grounded shield layer atomization issues and affecting the transmittance.

Furthermore, with respect to fabrication of the bonding electrode using ITO on the same layer as the grounded shield layer, the bonding electrode in the present disclosure is fabricated at the same time as the noise reduction metal layer, i.e., the bonding electrode is made of a metal material instead of ITO, so a pattern of the grounded shield layer and a pattern of the bonding electrode do not coincide. The situation that the bonding electrode made of the ITO material is exposed to a hydrogen-rich environment to affect its electrical performance during subsequent fabrication of the film layers of the collimating structure in the chemical vapor deposition equipment is avoided.

It will be apparent to those skilled in the art that various modifications and variations may be made to the present disclosure without departing from the spirit and scope of the present disclosure. In this case, if these modifications and variations of the present disclosure belong to the scope of claims and their equivalents, the present disclosure intends to include these modifications and variations.

What is claimed is:

1. A line recognition module, comprising a line recognition area and a bonding area arranged in a peripheral area of the line recognition area, wherein the line recognition module comprises:
    a substrate;
    an optical sensing structure located on the substrate and within the line recognition area; and
    a collimating structure located on a side of the optical sensing structure facing away from the substrate, at least located within the line recognition area and not covering the bonding area, wherein the collimating structure comprises at least two light shading layers disposed in a stacked manner and a light transmitting layer located between every two adjacent light shading layers, each of the light shading layers has light transmitting holes arranged in an array, the light transmitting holes in respective light shading layers are in one-to-one correspondence, and at least part of orthographic projections of the light transmitting holes onto the substrate coincide;
    wherein a collimation light collection angle θ of the collimating structure satisfies a following relationship: tanθ=D/H-Cmin/2Hx, wherein D is an aperture of a light transmitting hole, H is a height of the collimating structure, Cmin is a finger valley-ridge interval, and Hx is an interval from a finger to the collimating structure.

2. The line recognition module according to claim 1, wherein the light transmitting layer comprises a transparent resin layer and a transparent inorganic insulating layer; and
    between the two adjacent light shading layers, the transparent resin layer is contiguous with the light shading layer on a side adjacent to the substrate, and the transparent inorganic insulating layer is contiguous with the light shading layer on a side away from the substrate.

3. The line recognition module according to claim 2, wherein the collimating structure comprises a first light shading layer, a first transparent resin layer, a first transparent inorganic insulating layer, a second light shading layer, a second transparent resin layer, a second transparent inorganic insulating layer and a third light shading layer disposed in sequence in a stacked manner on the optical sensing structure; and
    the first light shading layer comprises first light transmitting holes arranged in an array, the second light shading layer comprises second light transmitting holes arranged in an array, and the third light shading layer comprises third light transmitting holes arranged in an array;

wherein an aperture of each of the first light transmitting holes is greater than or equal to an aperture of each of the third light transmitting holes.

4. The line recognition module according to claim 3, wherein an aperture of each of the second light transmitting holes is equal to the aperture of each of the first light transmitting holes; or
an aperture of each of the second light transmitting holes is 50% to 80% of the aperture of each of the first light transmitting holes; or
the apertures of the first light transmitting holes, the second light transmitting holes and the third light transmitting holes successively decrease.

5. The line recognition module according to claim 4, wherein the aperture of each of the first light transmitting holes ranges from 3 μm to 8 μm, a period of each of the first light transmitting holes ranges from 10 μm to 40 μm, a thickness of the first transparent resin layer ranges from 10 μm to 15 μm, and a thickness of the second transparent resin layer ranges from 8 μm to 12 μm.

6. The line recognition module according to claim 2, wherein the collimating structure comprises a first light shading layer, a transparent resin layer, a transparent inorganic insulating layer and a second light shading layer arranged in sequence in a stacked manner on the optical sensing structure; and
the first light shading layer comprises first light transmitting holes arranged in an array, and the second light shading layer comprises second light transmitting holes arranged in an array;
wherein an aperture of each of the first light transmitting holes is equal to an aperture of each of the second light transmitting holes.

7. The line recognition module according to claim 6, wherein the aperture of each of the first light transmitting holes ranges from 2 μm to 10 μm, a period of each of the first light transmitting holes ranges from 13 μm to 60 μm, and a thickness of the transparent resin layer ranges from 5 μm to 30 μm.

8. The line recognition module according to claim 1, wherein orthographic projections of centers of the light transmitting holes in one-to-one correspondence in each of the light shading layers on the substrate coincide, and periods of the light transmitting holes in each of the light shading layers are the same.

9. The line recognition module according to claim 1, wherein the optical sensing structure comprises a plurality of optical sensors arranged in an array, and one of the optical sensors corresponds to the light transmitting holes in each of the light shading layers.

10. The line recognition module according to claim 1, wherein the optical sensing structure comprises a gate, a gate insulating layer, an active layer, a source-drain layer, a first insulating layer, a first electrode, a semiconductor layer, a second electrode, a protective layer, a passivation layer, a second insulating layer, a bias voltage line, and a barrier layer arranged in sequence in a stacked manner.

11. The line recognition module according to claim 2, wherein the light shading layers extend from the line recognition area to an adjoining edge of the peripheral area;
an orthographic projection of the transparent resin layer on the substrate completely covers an orthographic projection of the light shading layer contiguous with the transparent resin layer on the substrate; and
an orthographic projection of the transparent inorganic insulating layer on the substrate completely covers and is larger than the orthographic projection of the transparent resin layer contiguous with the transparent inorganic insulating layer on the substrate;
wherein the collimating structure further comprises a retaining wall structure arranged around the transparent resin layer and independent of the light shading layer contiguous with the transparent resin layer on the same layer.

12. The line recognition module according to claim 1, further comprising:
a planarization layer located between the collimating structure and the optical sensing structure, wherein the planarization layer is arranged in an intact surface manner and has a hollow-out pattern only in the bonding area; and
a grounded shield layer located between the planarization layer and the optical sensing structure; wherein the grounded shield layer is contiguous with the planarization layer, a pattern of the grounded shield layer is covered by a pattern of the planarization layer, and an orthographic projection of the grounded shield layer on the substrate covers the optical sensing structure.

13. The line recognition module according to claim 12, further comprising: a noise reduction metal layer located between the grounded shield layer and the optical sensing structure; wherein
the line recognition area comprises a photosensitive area, an interval area, and a light shading area, and the interval area is located between the photosensitive area and the light shading area;
the optical sensing structure is disposed within the photosensitive area and the light shading area, with no pattern disposed within the interval area; and
the noise reduction metal layer covers the light shading area;
wherein the light shading area is located on one side or on two opposite sides of the photosensitive area.

14. The line recognition module according to claim 13, further comprising: a third insulating layer located between the grounded shield layer and the noise reduction metal layer; wherein
the noise reduction metal layer covers the interval area, and within the interval area, the noise reduction metal layer is electrically connected with the grounded shield layer through a plurality of via holes penetrating through the third insulating layer.

15. The line recognition module according to claim 13, further comprising: a bonding electrode located within the bonding area and arranged on the same layer as the noise reduction metal layer.

16. The line recognition module according to claim 15, wherein the bonding area comprises a gate drive chip bonding area, and a bonding electrode located in the gate drive chip bonding area is referred to as a first bonding electrode;
a first connection electrode located on a film layer where a gate is located, a second connection electrode located on a source-drain layer, a third connection electrode located on a film layer where a first electrode is located, and a fourth connection electrode located on a bias voltage line are arranged between the first bonding electrode and the substrate; and
the first connection electrode is electrically connected with the second connection electrode by a first via hole penetrating through a gate insulating layer, the second connection electrode is electrically connected with the third connection electrode by a second via hole penetrating through a first insulating layer, the third connection electrode is electrically connected with the fourth connection electrode by a third via hole penetrating through a second insulating layer, and the fourth connection electrode is electrically connected with the first bonding electrode by a fourth via hole penetrating through a third insulating layer; and the first connection electrode is electrically connected with the gate through a gate line and a gate line fan-out routing wire.

17. The line recognition module according to claim 16, wherein the first via hole, the second via hole, and the third via hole corresponding to one first bonding electrode are each at least two in number, orthographic projections of the first via holes, the second via holes, and the third via holes on the substrate do not overlap with one another, the first via holes, the second via holes and the third via holes are arranged alternately in an extension direction of the first bonding electrode, and the one first bonding electrode corresponds to one of the fourth via hole whose orthographic projections on the substrate simultaneously cover the first via holes, the second via holes, and the third via holes.

18. The line recognition module according to claim 17, wherein the bonding area further comprises a data drive chip bonding area, and bonding electrodes located within the data drive chip bonding area are referred to as a second bonding electrode and a third bonding electrode;
  a fifth connection electrode located on the source-drain layer, a sixth connection electrode located on the film layer where the first electrode is located, and a seventh connection electrode located on the bias voltage line are arranged between the second bonding electrode and the substrate; and the seventh connection electrode is electrically connected with the source-drain layer through a data line and a data line fan-out routing wire; and
  the third bonding electrode is located at one side edge of the data drive chip bonding area, and an eighth connection electrode located on the bias voltage line is arranged between the third bonding electrode and the substrate; and the eighth connection electrode is electrically connected with the bias voltage line through a bias voltage fan-out routing wire.

19. A display device, comprising a line recognition module, and a display panel located on the line recognition module, wherein the display panel and the line recognition module are fixed by an optically clear adhesive, and the line recognition module comprises: a line recognition area and a bonding area arranged in a peripheral area of the line recognition area, wherein the line recognition module comprises:
  a substrate;
  an optical sensing structure located on the substrate and within the line recognition area; and
  a collimating structure located on a side of the optical sensing structure facing away from the substrate, at least located within the line recognition area and not covering the bonding area, wherein the collimating structure comprises at least two light shading layers disposed in a stacked manner and a light transmitting layer located between every two adjacent light shading layers, each of the light shading layers has light transmitting holes arranged in an array, the light transmitting holes in respective light shading layers are in one-to-one correspondence, and at least part of orthographic projections of the light transmitting holes onto the substrate coincide;
  wherein a collimation light collection angle $\theta$ of the collimating structure satisfies a following relationship: $\tan\theta = D/H = C_{min}/2H_x$, wherein D is an aperture of a light transmitting hole, H is a height of the collimating structure, $C_{min}$ is a finger valley-ridge interval, and $H_x$ is an interval from a finger to the collimating structure.

* * * * *